(12) United States Patent
Shi et al.

(10) Patent No.: US 11,889,717 B2
(45) Date of Patent: Jan. 30, 2024

(54) LIGHT EMISSION DISPLAY ELEMENT AND DEVICE WITH POLARIZED AND ANGULARLY-CONTROLLED OUTPUT

(71) Applicant: META PLATFORMS TECHNOLOGIES, LLC, Menlo Park, CA (US)

(72) Inventors: Zhimin Shi, Bellevue, WA (US); Yuge Huang, Oviedo, FL (US); Fenglin Peng, Redmond, WA (US); Anurag Tyagi, Mill Creek, WA (US)

(73) Assignee: META PLATFORMS TECHNOLOGIES, LLC, Menlo Park, CA (US)

( * ) Notice: Subject to any disclaimer, the term of this patent is extended or adjusted under 35 U.S.C. 154(b) by 57 days.

(21) Appl. No.: 17/559,212

(22) Filed: Dec. 22, 2021

(65) Prior Publication Data
US 2023/0084436 A1 Mar. 16, 2023

Related U.S. Application Data

(60) Provisional application No. 63/245,144, filed on Sep. 16, 2021.

(51) Int. Cl.
*H10K 50/852* (2023.01)
*G09G 3/00* (2006.01)
(Continued)

(52) U.S. Cl.
CPC ........... *H10K 50/852* (2023.02); *G09G 3/002* (2013.01); *G09G 3/32* (2013.01); *H10K 50/822* (2023.02);
(Continued)

(58) Field of Classification Search
CPC .. G09G 3/002; G09G 2320/0295; G09G 3/32; H10K 50/852; H10K 50/822; H10K 59/80521; H10K 59/878; H10K 59/12
See application file for complete search history.

(56) References Cited

U.S. PATENT DOCUMENTS 6,639,250 B1 * 10/2003 Shimoda .............. H10K 50/125
257/89
10,615,372 B2 4/2020 Joo et al.
(Continued)

FOREIGN PATENT DOCUMENTS

KR 20190076832 A 7/2019
WO 2007004106 A1 1/2007

OTHER PUBLICATIONS

International Search report and Written Opinion for International Application No. PCT/US2022/043691, dated Dec. 14, 2022, 10 pages.
(Continued)

*Primary Examiner* — Muhammad N Edun
(74) *Attorney, Agent, or Firm* — MILLBURN IP PLLC

(57) ABSTRACT

Various embodiments set forth light emission display elements, and display devices that include such display elements. In some embodiments, a display element includes an electroluminescent light source and a pair of reflective elements that form a resonant cavity for a particular range of wavelengths and/or a particular polarization of light. One or both of the reflective elements can include meta-reflectors, such as anisotropic meta-reflectors or chiral meta-reflectors. An optional waveplate can be placed between the reflective elements to adjust the polarization state of light emitted by the display element.

24 Claims, 19 Drawing Sheets

(51) Int. Cl.
*G09G 3/32* (2016.01)
*H10K 50/822* (2023.01)
*H10K 59/12* (2023.01)

(52) U.S. Cl.
CPC ..... *G09G 2320/0295* (2013.01); *H10K 59/12* (2023.02)

(56) References Cited

U.S. PATENT DOCUMENTS

| | | |
|---|---|---|
| 2008/0128728 A1 | 6/2008 | Nemchuk et al. |
| 2019/0198817 A1* | 6/2019 | Joo ........................ H01L 33/465 |
| 2019/0229295 A1 | 7/2019 | Wang et al. |
| 2022/0020828 A1* | 1/2022 | Lee ........................ H10K 59/30 |

OTHER PUBLICATIONS

W.- J. Joo et al., "Metasurface-driven OLED displays beyond 10,000 pixels per inch," Science, 370 (6515), 459-463 (2020), 6 pages.

\* cited by examiner

LIGHT EMISSION DISPLAY ELEMENT AND DEVICE WITH POLARIZED AND ANGULARLY-CONTROLLED OUTPUT

CROSS-REFERENCE TO RELATED APPLICATIONS

This application claims priority benefit of the U.S. Provisional Patent Application titled, "LIGHT EMISSION DISPLAY ELEMENT AND SYSTEM WITH POLARIZED AND ANGULARLY-CONTROLLED OUTPUT," filed on Sep. 16, 2021 and having Ser. No. 63/245,144. The subject matter of this related application is hereby incorporated herein by reference.

BACKGROUND

Field of the Various Embodiments

Embodiments of this disclosure relate generally to display systems and, more specifically, to light emission display elements and devices with polarized and angularly-controlled output.

Description of the Related Art

Artificial reality systems display content that may include completely generated content or generated content combined with captured (e.g., real-world) content. An artificial reality system can include a display device that emits light and optical elements that act on the emitted light and/or real-world light to modulate, combine, and redirect light towards the eyes of a viewer.

The optical elements used in artificial reality and other optical systems are oftentimes polarization sensitive. As a general matter, conventional light emission display devices, such as conventional OLED (organic light-emitting diode), QLED (quantum light-emitting diode), QDEL (quantum dot electro luminescent), and PeLED (Perovskite light-emitting diode) devices, output light that is unpolarized. In order to use a conventional light emission display device together with polarization-sensitive optical elements, unpolarized light that is output by such a display device must be polarized, via a polarizer, in a manner that is compatible with the polarization-sensitive optical elements. However, the polarizer can filter out more than fifty percent of the light that is output by the conventional light emission display device, reducing the brightness and power efficiency of an artificial reality or other optical system that includes such a light emission display device.

As the foregoing illustrates, what is needed in the art are more effective display elements and devices.

SUMMARY

One embodiment of the present disclosure sets forth a display element. The display element includes an electroluminescent (EL) light source. The display element further includes a plurality of reflective elements. The plurality of reflective elements form a resonant cavity for a polarization of light.

Another embodiment of the present disclosure sets forth a display device. The display device includes a plurality of pixels. Each of the pixels includes an EL element and a plurality of reflective elements. The plurality of reflective elements form a resonant cavity for a polarization of light.

Another embodiment of the present disclosure sets forth a computer-implemented method. The method includes determining states of a plurality of pixels for at least one point in time. The method further includes driving each pixel included in the plurality of pixels based on a corresponding state, where driving the pixel includes driving an EL element to emit light within an optical cavity. A polarization of light is resonant within the optical cavity.

Other embodiments of the present disclosure include, without limitation, a computer-readable medium including instructions for performing one or more aspects of the disclosed techniques as well as a computing device for performing one or more aspects of the disclosed techniques.

One advantage of the display devices disclosed herein is that the disclosed display devices emit polarized light. Accordingly, the disclosed display devices can be used in conjunction with polarization-sensitive optical elements to produce light with higher brightness and power efficiency relative to light that is produced when conventional display devices are used in conjunction with polarization-sensitive optical elements. Further, different groups of pixels in the disclosed display devices can be configured to produce output light of different polarization states, which can enable polarization multiplexing. In addition, the reflection properties of each meta-reflector (which can include multiple nanostructures) corresponding to a pixel or sub-pixel can be configured to tailor the light emission angular profile of that pixel or sub-pixel. These technical advantages represent one or more technological advancements over prior art approaches.

BRIEF DESCRIPTION OF THE DRAWINGS

So that the manner in which the above recited features of the various embodiments can be understood in detail, a more particular description of the disclosed concepts, briefly summarized above, may be had by reference to various embodiments, some of which are illustrated in the appended drawings. It is to be noted, however, that the appended drawings illustrate only typical embodiments of the disclosed concepts and are therefore not to be considered limiting of scope in any way, and that there are other equally effective embodiments.

DETAILED DESCRIPTION

In the following description, numerous specific details are set forth to provide a more thorough understanding of the various embodiments. However, it is apparent to one of skilled in the art that the disclosed concepts may be practiced without one or more of these specific details.

Configuration Overview

One or more embodiments disclosed herein relate to light emission display elements and display devices that include such display elements. In some embodiments, a display element includes an electroluminescent (EL) light source and a pair of reflective elements that form a resonant cavity for a particular range of wavelengths and/or a particular polarization of light. One or both of the reflective elements can include meta-reflectors, such as anisotropic meta-reflectors or chiral meta-reflectors. An optional waveplate can be placed between the reflective elements to adjust the polarization state of light emitted by the display element. In some embodiments, the display element can be included as a pixel within a display device.

Embodiments of the disclosure may also include or be implemented in conjunction with an artificial reality system. Artificial reality is a form of reality that has been adjusted in some manner before presentation to a user, which may include, for example, a virtual reality (VR) system, an augmented reality (AR) system, a mixed reality (MR) system, a hybrid reality system, or some combination and/or derivatives thereof. Artificial reality content may include, without limitation, completely generated content or generated content combined with captured (e.g., real-world) content. The artificial reality content may include, without limitation, video, audio, haptic feedback, or some combination thereof. The artificial reality content may be presented in a single channel or in multiple channels (such as stereo video that produces a three-dimensional effect to the viewer). Additionally, in some embodiments, artificial reality systems may also be associated with applications, products, accessories, services, or some combination thereof, that are used to, e.g., create content in an artificial reality system and/or are otherwise used in (e.g., perform activities in) an artificial reality system. The artificial reality system may be implemented on various platforms, including a head-mounted display (HMD) connected to a host computer system, a standalone HMD, a mobile device or computing system, or any other hardware platform capable of providing artificial reality content to one or more viewers.

System Overview

Figure 1A:
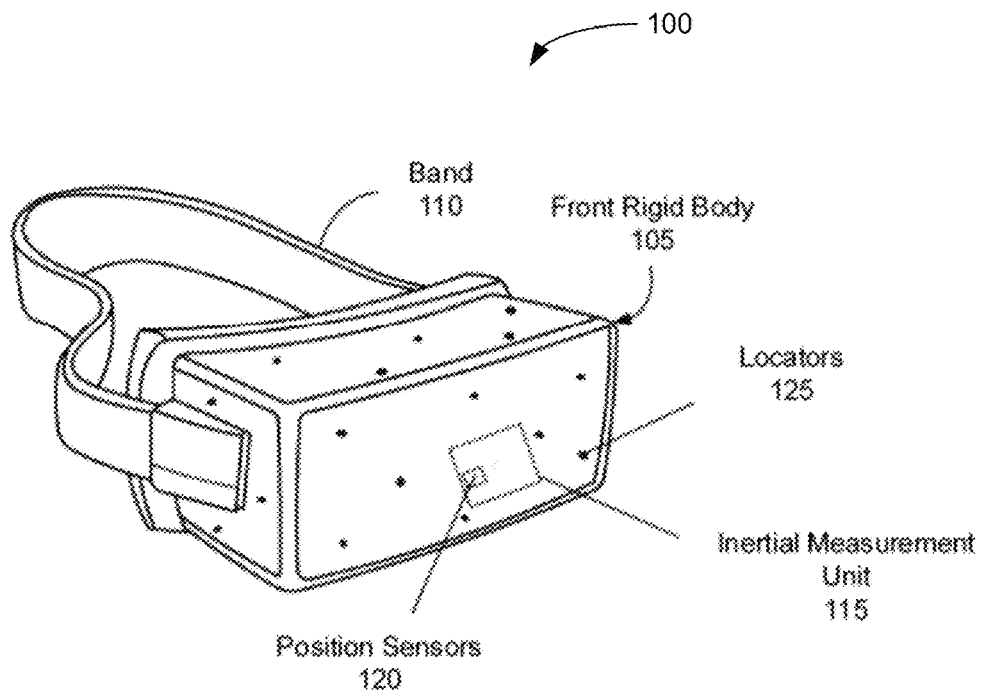
FIG. 1A is a diagram of a near eye display (NED), according to various embodiments.

FIG. 1A is a wire diagram of a near eye display (NED) 100, according to various embodiments. Although NEDs and head mounted displays (HMDs) are disclosed herein as reference examples, the display elements and display devices that are disclosed herein can also be configured for placement in proximity of an eye or eyes of the user at a fixed location, without being head-mounted (e.g., the display device may be mounted in a vehicle, such as a car or an airplane, for placement in front of an eye or eyes of the user).

As shown, the NED 100 includes a front rigid body 105 and a band 110. The front rigid body 105 includes one or more electronic display elements of an electronic display (not shown), an inertial measurement unit (IMU) 115, one or more position sensors 120, and locators 125. As illustrated in FIG. 1A, position sensors 120 are located within the IMU 115, and neither the IMU 115 nor the position sensors 120 are visible to the user. In various embodiments, where the NED 100 acts as an AR or MR device, portions of the NED 100 and/or its internal components are at least partially transparent.

Figure 1B:
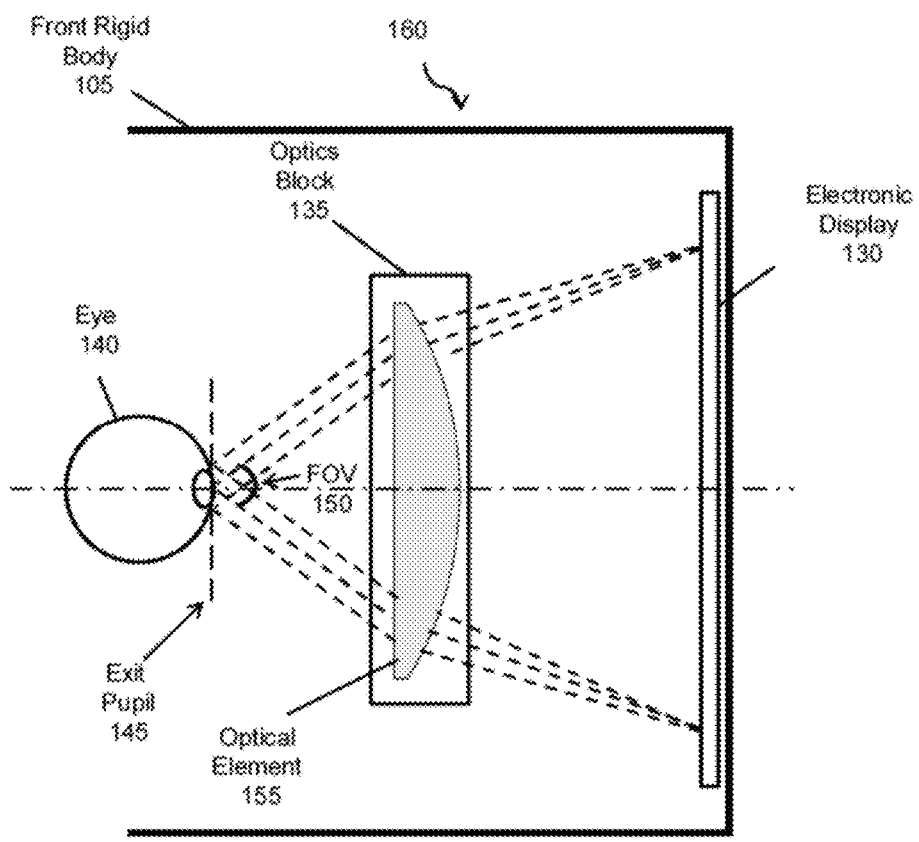
FIG. 1B is a cross section of the front rigid body of the embodiments of the NED illustrated in FIG. 1A.

FIG. 1B is a cross section 160 of the front rigid body 105 of the embodiments of the NED 100 illustrated in FIG. 1A. As shown, the front rigid body 105 includes an electronic display 130 and an optics block 135 that together provide image light to an exit pupil 145. The exit pupil 145 is the location of the front rigid body 105 where a user's eye 140 may be positioned. For purposes of illustration, FIG. 1B illustrates a cross section 160 associated with a single eye 140, but another optics block, separate from the optics block 135, may provide altered image light to another eye of the user. Additionally, the NED 100 includes an eye tracking system (not shown in FIG. 1B). The eye tracking system may include one or more sources that illuminate one or both eyes of the user. The eye tracking system may also include one or more cameras that capture images of one or both eyes of the user to track the positions of the eyes.

The electronic display 130 displays images to the user. In various embodiments, the electronic display 130 may comprise a single electronic display or multiple electronic displays (e.g., a display for each eye of a user). Examples of the electronic display 130 include: a liquid crystal display (LCD), an organic light emitting diode (OLED) display, an active-matrix organic light-emitting diode display (AMOLED), a QOLED, a QLED, some other display, or some combination thereof. In some embodiments, the electronic display 130 can include one or more of the light emission display elements and devices discussed in detail below in conjunction with FIGS. 4-18.

The optics block 135 adjusts an orientation of image light emitted from the electronic display 130 such that the electronic display 130 appears at particular virtual image distances from the user. The optics block 135 is configured to receive image light emitted from the electronic display 130 and direct the image light to an eye-box associated with the exit pupil 145. The image light directed to the eye-box forms an image at a retina of eye 140. The eye-box is a region defining how much the eye 140 moves up/down/left/right from without significant degradation in the image quality. In the illustration of FIG. 1B, a field of view (FOV) 150 is the extent of the observable world that is seen by the eye 140 at any given moment.

Additionally, in some embodiments, the optics block 135 magnifies received light, corrects optical errors associated with the image light, and presents the corrected image light to the eye 140. The optics block 135 may include one or more optical elements 155 in optical series. An optical element 155 may be an aperture, a Fresnel lens, a convex lens, a concave lens, a filter, a waveguide, a PBP lens or grating, a color-selective filter, a waveplate, a C-plate, a spatial light modulator, or any other suitable optical element 155 that affects the image light. Moreover, the optics block 135 may include combinations of different optical elements. One or more of the optical elements in the optics block 135 may have one or more coatings, such as anti-reflective coatings. In some embodiments, the optics block 135 may include one or more of the optical patterning systems discussed in detail below in conjunction with FIGS. 4-14.

Figure 2A:
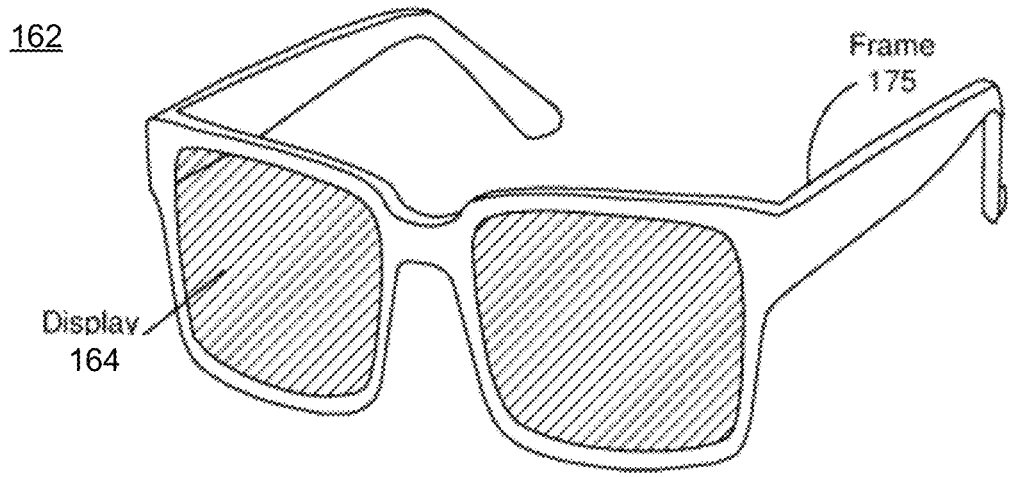
FIG. 2A is a diagram of a head-mounted display (HMD) implemented as a NED, according to various embodiments.

FIG. 2A is a diagram of an HMD 162 implemented as a NED, according to various embodiments. As shown, the HMD 162 is in the form of a pair of augmented reality glasses. The HMD 162 presents computer-generated media to a user and augments views of a physical, real-world environment with the computer-generated media. Examples of computer-generated media presented by the HMD 162 include one or more images, video, audio, or some combination thereof. In some embodiments, audio is presented via an external device (e.g., speakers and headphones) that receives audio information from the HMD 162, a console (not shown), or both, and presents audio data based on audio information. In some embodiments, the HMD 162 may be modified to also operate as a virtual reality (VR) HMD, a mixed reality (MR) HMD, or some combination thereof. The HMD 162 includes a frame 175 and a display 164. As shown, the frame 175 mounts the near eye display to the user's head, while the display 164 provides image light to the user. The display 164 may be customized to a variety of shapes and sizes to conform to different styles of eyeglass frames.

Figure 2B:
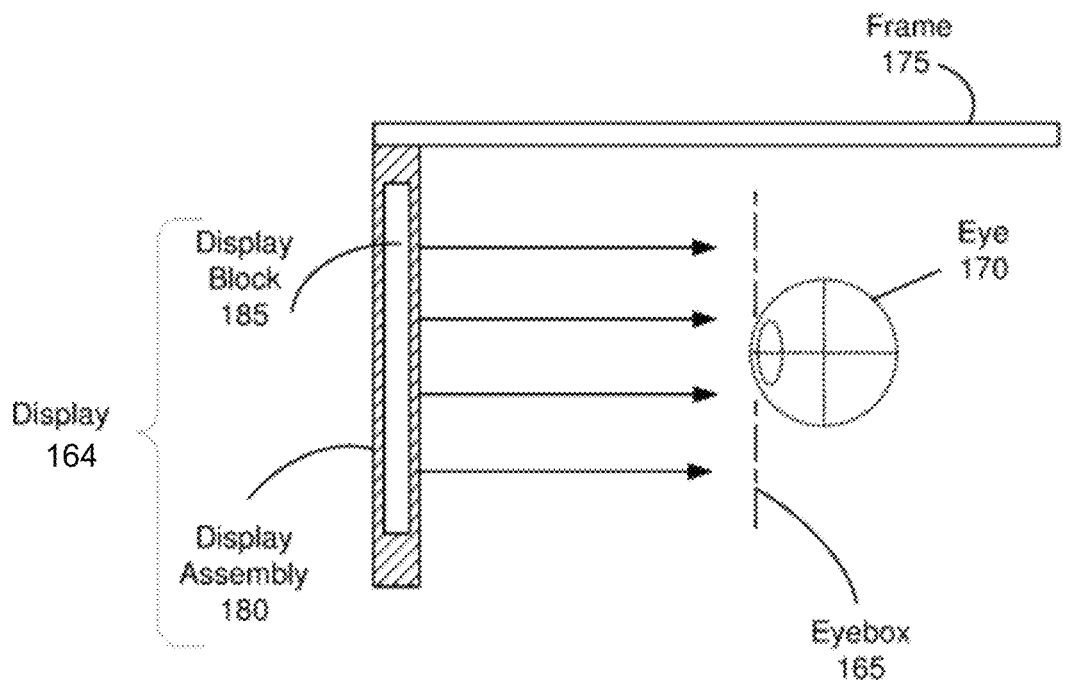
FIG. 2B is a cross-section view of the HMD of FIG. 2A implemented as a near eye display, according to various embodiments.

FIG. 2B is a cross-section view of the HMD 162 of FIG. 2A implemented as a NED, according to various embodiments. This view includes frame 175, display 164 (which comprises a display assembly 180 and a display block 185), and eye 170. The display assembly 180 supplies image light to the eye 170. The display assembly 180 houses display block 185, which, in different embodiments, encloses the different types of imaging optics and redirection structures. For purposes of illustration, FIG. 2B shows the cross section associated with a single display block 185 and a single eye 170, but in alternative embodiments not shown, another display block, which is separate from display block 185 shown in FIG. 2B, provides image light to another eye of the user.

The display block 185, as illustrated, is configured to combine light from a local area with light from a computer generated image to form an augmented scene. The display block 185 is also configured to provide the augmented scene to the eyebox 165 corresponding to a location of the user's eye 170. The display block 185 may include, for example, a waveguide display, a focusing assembly, a compensation assembly, or some combination thereof.

HMD 162 may include one or more other optical elements between the display block 185 and the eye 170. The optical elements may act to, for example, correct aberrations in image light emitted from the display block 185, magnify image light emitted from the display block 185, some other optical adjustment of image light emitted from the display block 185, or some combination thereof. The example for optical elements may include an aperture, a Fresnel lens, a convex lens, a concave lens, a filter, or any other suitable optical element that affects image light. The display block 185 may also comprise one or more materials (e.g., plastic, glass, etc.) with one or more refractive indices that effectively minimize the weight and widen a field of view of the HMD 162.

Figure 3:
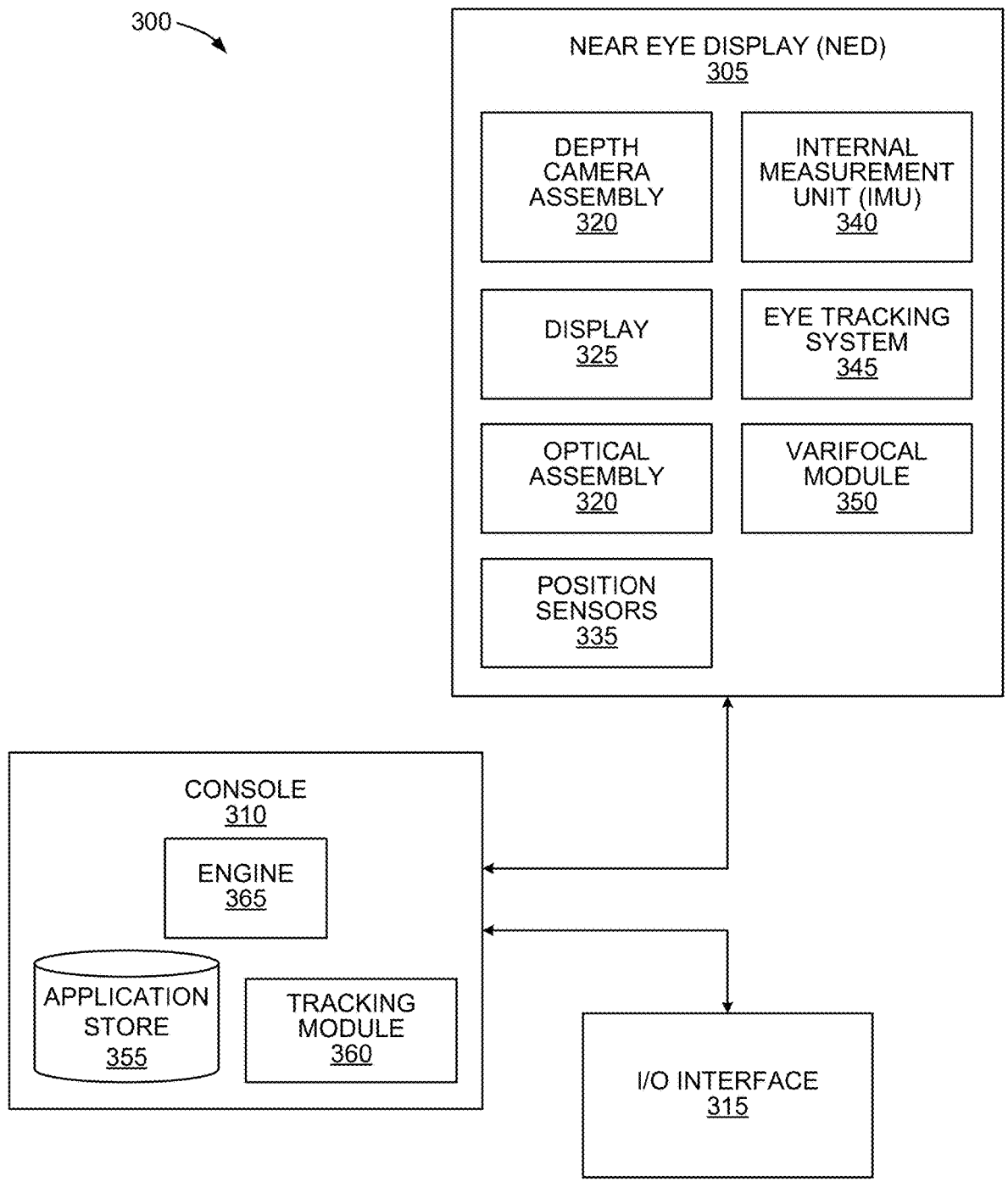
FIG. 3 is a block diagram of a NED system, according to various embodiments.

FIG. 3 is a block diagram of an embodiment of a near eye display system 300 in which a console 310 operates. In some embodiments, the NED system 300 corresponds to the NED 100 or the HMD 162. The NED system 300 may operate in a virtual reality (VR) system environment, an augmented reality (AR) system environment, a mixed reality (MR) system environment, or some combination thereof. The NED system 300 shown in FIG. 3 comprises a NED 305 and an input/output (I/O) interface 315 that is coupled to the console 310.

While FIG. 3 shows an example NED system 300 including one NED 305 and one I/O interface 315, in other embodiments any number of these components may be included in the NED system 300. For example, there may be multiple NEDs 305 that each has an associated I/O interface 315, where each NED 305 and I/O interface 315 communicates with the console 310. In alternative configurations, different and/or additional components may be included in the NED system 300. Additionally, various components included within the NED 305, the console 310, and the I/O interface 315 may be distributed in a different manner than is described in conjunction with FIG. 3 in some embodiments. For example, some or all of the functionality of the console 310 may be provided by the NED 305.

The NED 305 may be a head-mounted display that presents content to a user. The content may include virtual and/or augmented views of a physical, real-world environment including computer-generated elements (e.g., two-dimensional or three-dimensional images, two-dimensional or three-dimensional video, sound, etc.). In some embodiments, the NED 305 may also present audio content to a user. The NED 305 and/or the console 310 may transmit the audio content to an external device via the I/O interface 315. The external device may include various forms of speaker systems and/or headphones. In various embodiments, the audio content is synchronized with visual content being displayed by the NED 305.

The NED 305 may comprise one or more rigid bodies, which may be rigidly or non-rigidly coupled together. A rigid coupling between rigid bodies causes the coupled rigid bodies to act as a single rigid entity. In contrast, a non-rigid coupling between rigid bodies allows the rigid bodies to move relative to each other.

As shown in FIG. 3, the NED 305 may include a depth camera assembly (DCA) 320, a display 325, an optical assembly 330, one or more position sensors 335, an inertial measurement unit (IMU) 340, an eye tracking system 345, and a varifocal module 350. In some embodiments, the display 325 and the optical assembly 330 can be integrated together into a projection assembly. Various embodiments of the NED 305 may have additional, fewer, or different components than those listed above. Additionally, the functionality of each component may be partially or completely encompassed by the functionality of one or more other components in various embodiments.

The DCA 320 captures sensor data describing depth information of an area surrounding the NED 305. The sensor data may be generated by one or a combination of depth imaging techniques, such as triangulation, structured light imaging, time-of-flight imaging, laser scan, and so forth. The DCA 320 can compute various depth properties of the area surrounding the NED 305 using the sensor data. Additionally or alternatively, the DCA 320 may transmit the sensor data to the console 310 for processing.

The DCA 320 includes an illumination source, an imaging device, and a controller. The illumination source emits light onto an area surrounding the NED 305. In an embodiment, the emitted light is structured light. The illumination source includes a plurality of emitters that each emits light having certain characteristics (e.g., wavelength, polarization, coherence, temporal behavior, etc.). The characteristics may be the same or different between emitters, and the emitters can be operated simultaneously or individually. In one embodiment, the plurality of emitters could be, e.g., laser diodes (such as edge emitters), inorganic or organic light-emitting diodes (LEDs), a vertical-cavity surface-emitting laser (VCSEL), or some other source. In some embodiments, a single emitter or a plurality of emitters in the illumination source can emit light having a structured light pattern. The imaging device captures ambient light in the environment surrounding NED 305, in addition to light reflected off of objects in the environment that is generated by the plurality of emitters. In various embodiments, the imaging device may be an infrared camera or a camera configured to operate in a visible spectrum. The controller coordinates how the illumination source emits light and how the imaging device captures light. For example, the controller may determine a brightness of the emitted light. In some embodiments, the controller also analyzes detected light to detect objects in the environment and position information related to those objects.

The display 325 displays two-dimensional or three-dimensional images to the user in accordance with pixel data received from the console 310. In various embodiments, the display 325 comprises a single display or multiple displays (e.g., separate displays for each eye of a user). In some embodiments, the display 325 comprises a single or multiple waveguide displays. Light can be coupled into the single or multiple waveguide displays via, e.g., a liquid crystal display (LCD), an organic light emitting diode (OLED) display, an inorganic light emitting diode (ILED) display, an active-matrix organic light-emitting diode (AMOLED) display, a transparent organic light emitting diode (TOLED) display, a laser-based display, one or more waveguides, other types of displays, a scanner, a one-dimensional array, and so forth. In addition, combinations of the display types may be incorporated in display 325 and used separately, in parallel, and/or in combination.

The optical assembly 330 magnifies image light received from the display 325, corrects optical errors associated with the image light, and presents the corrected image light to a user of the NED 305. The optical assembly 330 includes a plurality of optical elements. For example, one or more of the following optical elements may be included in the optical assembly 330: an aperture, a Fresnel lens, a convex lens, a concave lens, a filter, a reflecting surface, or any other suitable optical element that deflects, reflects, refracts, and/or in some way alters image light. Moreover, the optical assembly 330 may include combinations of different optical elements. In some embodiments, one or more of the optical elements in the optical assembly 330 may have one or more coatings, such as partially reflective or antireflective coatings. The optical assembly 330 can be integrated into a projection assembly, e.g., a projection assembly. In one embodiment, the optical assembly 330 includes the optics block 155.

In operation, the optical assembly 330 magnifies and focuses image light generated by the display 325. In so doing, the optical assembly 330 enables the display 325 to be physically smaller, weigh less, and consume less power than displays that do not use the optical assembly 330. Additionally, magnification may increase the field of view of the content presented by the display 325. For example, in some embodiments, the field of view of the displayed content partially or completely uses a user's field of view. For example, the field of view of a displayed image may meet or exceed 310 degrees. In various embodiments, the amount of magnification may be adjusted by adding or removing optical elements.

In some embodiments, the optical assembly 330 may be designed to correct one or more types of optical errors. Examples of optical errors include barrel or pincushion distortions, longitudinal chromatic aberrations, or transverse chromatic aberrations. Other types of optical errors may further include spherical aberrations, chromatic aberrations or errors due to the lens field curvature, astigmatisms, in addition to other types of optical errors. In some embodiments, visual content transmitted to the display 325 is pre-distorted, and the optical assembly 330 corrects the distortion as image light from the display 325 passes through various optical elements of the optical assembly 330. In some embodiments, optical elements of the optical assembly 330 are integrated into the display 325 as a projection assembly that includes at least one waveguide coupled with one or more optical elements.

The IMU 340 is an electronic device that generates data indicating a position of the NED 305 based on measurement signals received from one or more of the position sensors 335 and from depth information received from the DCA 320. In some embodiments of the NED 305, the IMU 340 may be a dedicated hardware component. In other embodiments, the IMU 340 may be a software component implemented in one or more processors.

In operation, a position sensor 335 generates one or more measurement signals in response to a motion of the NED 305. Examples of position sensors 335 include: one or more accelerometers, one or more gyroscopes, one or more magnetometers, one or more altimeters, one or more inclinometers, and/or various types of sensors for motion detection, drift detection, and/or error detection. The position sensors 335 may be located external to the IMU 340, internal to the IMU 340, or some combination thereof.

Based on the one or more measurement signals from one or more position sensors 335, the IMU 340 generates data indicating an estimated current position of the NED 305 relative to an initial position of the NED 305. For example, the position sensors 335 may include multiple accelerometers to measure translational motion (forward/back, up/down, left/right) and multiple gyroscopes to measure rotational motion (e.g., pitch, yaw, and roll). In some embodiments, the IMU 340 rapidly samples the measurement signals and calculates the estimated current position of the NED 305 from the sampled data. For example, the IMU 340 may integrate the measurement signals received from the accelerometers over time to estimate a velocity vector and integrates the velocity vector over time to determine an estimated current position of a reference point on the NED 305. Alternatively, the IMU 340 provides the sampled measurement signals to the console 310, which analyzes the sample data to determine one or more measurement errors. The console 310 may further transmit one or more of control signals and/or measurement errors to the IMU 340 to configure the IMU 340 to correct and/or reduce one or more measurement errors (e.g., drift errors). The reference point is a point that may be used to describe the position of the NED 305. The reference point may generally be defined as a point in space or a position related to a position and/or orientation of the NED 305.

In various embodiments, the IMU 340 receives one or more parameters from the console 310. The one or more parameters are used to maintain tracking of the NED 305. Based on a received parameter, the IMU 340 may adjust one or more IMU parameters (e.g., a sample rate). In some embodiments, certain parameters cause the IMU 340 to update an initial position of the reference point so that it corresponds to a next position of the reference point. Updating the initial position of the reference point as the next calibrated position of the reference point helps reduce drift errors in detecting a current position estimate of the IMU 340.

In some embodiments, the eye tracking system 345 is integrated into the NED 305. The eye-tracking system 345 may comprise one or more illumination sources and an imaging device (camera). In operation, the eye tracking system 345 generates and analyzes tracking data related to a user's eyes as the user wears the NED 305. The eye tracking system 345 may further generate eye tracking information that may comprise information about a position of the user's eye, i.e., information about an angle of an eye-gaze.

In some embodiments, the varifocal module 350 is further integrated into the NED 305. The varifocal module 350 may be communicatively coupled to the eye tracking system 345 in order to enable the varifocal module 350 to receive eye tracking information from the eye tracking system 345. The varifocal module 350 may further modify the focus of image light emitted from the display 325 based on the eye tracking information received from the eye tracking system 345. Accordingly, the varifocal module 350 can reduce vergence-accommodation conflict that may be produced as the user's eyes resolve the image light. In various embodiments, the varifocal module 350 can be interfaced (e.g., either mechanically or electrically) with at least one optical element of the optical assembly 330.

In operation, the varifocal module 350 may adjust the position and/or orientation of one or more optical elements in the optical assembly 330 in order to adjust the focus of image light propagating through the optical assembly 330. In various embodiments, the varifocal module 350 may use eye tracking information obtained from the eye tracking system 345 to determine how to adjust one or more optical elements in the optical assembly 330. In some embodiments, the varifocal module 350 may perform foveated rendering of the image light based on the eye tracking information obtained from the eye tracking system 345 in order to adjust the resolution of the image light emitted by the display 325. In this case, the varifocal module 350 configures the display 325 to display a high pixel density in a foveal region of the user's eye-gaze and a low pixel density in other regions of the user's eye-gaze.

The I/O interface 315 facilitates the transfer of action requests from a user to the console 310. In addition, the I/O interface 315 facilitates the transfer of device feedback from the console 310 to the user. An action request is a request to perform a particular action. For example, an action request may be an instruction to start or end capture of image or video data or an instruction to perform a particular action within an application, such as pausing video playback, increasing or decreasing the volume of audio playback, and so forth. In various embodiments, the I/O interface 315 may include one or more input devices. Example input devices include: a keyboard, a mouse, a game controller, a joystick, and/or any other suitable device for receiving action requests and communicating the action requests to the console 310. In some embodiments, the I/O interface 315 includes an IMU 340 that captures calibration data indicating an estimated current position of the I/O interface 315 relative to an initial position of the I/O interface 315.

In operation, the I/O interface 315 receives action requests from the user and transmits those action requests to the console 310. Responsive to receiving the action request, the console 310 performs a corresponding action. For example, responsive to receiving an action request, the console 310 may configure the I/O interface 315 to emit haptic feedback onto an arm of the user. For example, the console 315 may configure the I/O interface 315 to deliver haptic feedback to a user when an action request is received. Additionally or alternatively, the console 310 may configure the I/O interface 315 to generate haptic feedback when the console 310 performs an action, responsive to receiving an action request.

The console 310 provides content to the NED 305 for processing in accordance with information received from one or more of: the DCA 320, the NED 305, and the I/O interface 315. As shown in FIG. 3, the console 310 includes an application store 355, a tracking module 360, and an engine 365. In some embodiments, the console 310 may have additional, fewer, or different modules and/or components than those described in conjunction with FIG. 3. Similarly, the functions further described below may be distributed among components of the console 310 in a different manner than described in conjunction with FIG. 3.

The application store 355 stores one or more applications for execution by the console 310. An application is a group of instructions that, when executed by a processor, performs a particular set of functions, such as generating content for presentation to the user. For example, an application may generate content in response to receiving inputs from a user (e.g., via movement of the NED 305 as the user moves his/her head, via the I/O interface 315, etc.). Examples of applications include: gaming applications, conferencing applications, video playback applications, or other suitable applications.

The tracking module 360 calibrates the NED system 300 using one or more calibration parameters. The tracking module 360 may further adjust one or more calibration parameters to reduce error in determining a position and/or orientation of the NED 305 or the I/O interface 315. For example, the tracking module 360 may transmit a calibration parameter to the DCA 320 in order to adjust the focus of the DCA 320. Accordingly, the DCA 320 may more accurately determine positions of structured light elements reflecting off of objects in the environment. The tracking module 360 may also analyze sensor data generated by the IMU 340 in determining various calibration parameters to modify. Further, in some embodiments, if the NED 305 loses tracking of the user's eye, then the tracking module 360 may re-calibrate some or all of the components in the NED system 300. For example, if the DCA 320 loses line of sight of at least a threshold number of structured light elements projected onto the user's eye, the tracking module 360 may transmit calibration parameters to the varifocal module 350 in order to re-establish eye tracking.

The tracking module 360 tracks the movements of the NED 305 and/or of the I/O interface 315 using information from the DCA 320, the one or more position sensors 335, the IMU 340 or some combination thereof. For example, the tracking module 360 may determine a reference position of the NED 305 from a mapping of an area local to the NED 305. The tracking module 360 may generate this mapping based on information received from the NED 305 itself. The tracking module 360 may also utilize sensor data from the IMU 340 and/or depth data from the DCA 320 to determine references positions for the NED 305 and/or I/O interface 315. In various embodiments, the tracking module 360 generates an estimation and/or prediction for a subsequent position of the NED 305 and/or the I/O interface 315. The tracking module 360 may transmit the predicted subsequent position to the engine 365.

The engine 365 generates a three-dimensional mapping of the area surrounding the NED 305 (e.g., the "local area") based on information received from the NED 305. In some embodiments, the engine 365 determines depth information for the three-dimensional mapping of the local area based on depth data received from the DCA 320 (e.g., depth information of objects in the local area). In some embodiments, the engine 365 calculates a depth and/or position of the NED 305 by using depth data generated by the DCA 320. In particular, the engine 365 may implement various techniques for calculating the depth and/or position of the NED 305, such as stereo based techniques, structured light illumination techniques, time-of-flight techniques, and so forth. In various embodiments, the engine 365 uses depth data received from the DCA 320 to update a model of the local area and to generate and/or modify media content based in part on the updated model.

The engine 365 also executes applications within the NED system 300 and receives position information, acceleration information, velocity information, predicted future positions, or some combination thereof, of the NED 305 from the tracking module 360. Based on the received information, the engine 365 determines various forms of media content to transmit to the NED 305 for presentation to the user. For example, if the received information indicates that the user has looked to the left, the engine 365 generates media content for the NED 305 that mirrors the user's movement in a virtual environment or in an environment augmenting the local area with additional media content. Accordingly, the engine 365 may generate and/or modify media content (e.g., visual and/or audio content) for presentation to the user. The engine 365 may further transmit the media content to the NED 305. Additionally, in response to receiving an action request from the I/O interface 315, the engine 365 may perform an action within an application executing on the console 310. The engine 305 may further provide feedback when the action is performed. For example, the engine 365 may configure the NED 305 to generate visual and/or audio feedback and/or the I/O interface 315 to generate haptic feedback to the user.

In some embodiments, based on the eye tracking information (e.g., orientation of the user's eye) received from the eye tracking system 345, the engine 365 determines a resolution of the media content provided to the NED 305 for presentation to the user on the display 325. The engine 365 may adjust a resolution of the visual content provided to the NED 305 by configuring the display 325 to perform foveated rendering of the visual content, based at least in part on a direction of the user's gaze received from the eye tracking system 345. The engine 365 provides the content to the NED 305 having a high resolution on the display 325 in a foveal region of the user's gaze and a low resolution in other regions, thereby reducing the power consumption of the NED 305. In addition, using foveated rendering reduces a number of computing cycles used in rendering visual content without compromising the quality of the user's visual experience. In some embodiments, the engine 365 can further use the eye tracking information to adjust a focus of the image light emitted from the display 325 in order to reduce vergence-accommodation conflicts.

Figure 4:
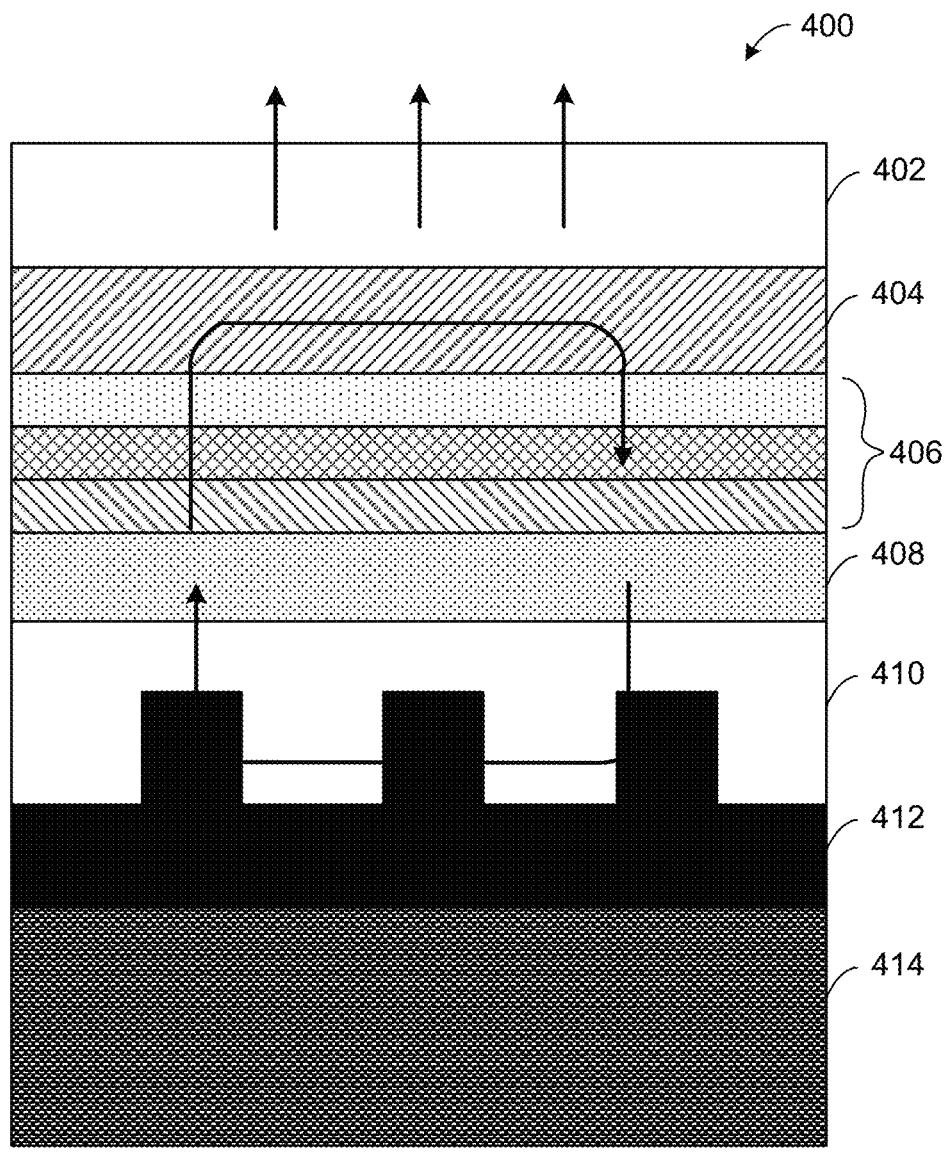
FIG. 4 illustrates a cross-section view of a display element, according to various embodiments.

Light Emission Display Element and Device with Polarized and Angularly-Controlled Output FIG. 4 illustrates a cross-section view of a display element 400, according to various embodiments. In some embodiments, the display element 400 corresponds to a pixel or a sub-pixel of a display device. All or some of the components shown in FIG. 4 may be in physical contact with one another, optically in contact with one another, have index matching fluid or optical glue between one another, and/or may have space therebetween.

As shown, the display element 400 includes a cap layer 402, a cathode layer 404, an electroluminescent (EL) light source 406, an anode layer 408, a planarization layer 410, a meta-reflector layer 412, and a substrate 414, each of which may be constructed from any technically feasible materials and have any suitable size. The EL light source 408 includes layers of EL material that emit light of different colors (e.g., red, green, and blue light), as well as optional carrier transport and blocking layers. For example, the EL light source 408 could be an OLED (organic light-emitting diode), QLED (quantum light-emitting diode), QDEL (quantum dot electro luminescent), or PeLED (Perovskite light-emitting diode) light source. In some embodiments, the anode layer 408 can be a pixelated optically-transparent layer, such as a pixelated Indium Tin Oxide (ITO) layer, that permits individual pixels to be independently driven to produce electric fields between portions of the anode layer 408 and the cathode layer 404 corresponding to those pixels, thereby causing corresponding portions of the EL light source 406 for those pixels to emit light, or not to emit light.

In operation, light emitted by the EL light source 406 is reflected within an optical cavity formed between the cathode layer 404 and the meta-reflector layer 412, examples of which are discussed in greater detail below in conjunction with FIGS. 5-7 and 9-11. As shown, the meta-reflector layer 412 is fully reflective, whereas the cathode layer 404 is partially reflective and permits some light to exit the display element 400. In some embodiments, the meta-reflector layer 412 may also be partially reflective and allow some light through.

In some embodiments, the meta-reflector layer 412 is an anisotropic or chiral meta-reflector that is polarization sensitive. When the meta-reflector 412 is used in conjunction with the cathode layer 404 to form an optical cavity, the emission of light having a particular polarization can be enhanced via resonance enhancement, which is also sometimes referred to as the Purcell effect. Accordingly, the display element 400 can output light having the particular polarization with much more power than light having another polarization. In some embodiments, the meta-reflector layer 412 is also wavelength sensitive. In such cases, the emission of light by the display element 400 within a particular range of wavelengths can be enhanced via resonance enhancement, and the display element 400 can output light within the particular range of wavelengths with much more power than light of other wavelengths. When a wavelength-sensitive meta-reflector layer 412 is used, the EL light source 408 can include layers of EL material that emit light of different colors (e.g., red, green, and blue light) without being pixelated, thereby reducing a dot pitch of a display device that includes the display element 400, because only one of the layers that emits light within the range of wavelengths that is resonant within the optical cavity will emit light efficiently.

To achieve resonance, the sum of a phase shift upon reflection of light having a particular polarization and being within a particular range of wavelengths from the cathode layer 404 at the top, a phase shift upon reflection of that light from the meta-reflector 412 at the bottom, and a phase accumulation from that light propagating through the optical cavity, should equal an integer multiple of two pi:

$$\phi_{r,top}+\phi_{r,bottom}+2\int k(z)dz=2m\pi$$

where $\phi_{r,top}$ is the phase shift upon reflection of light from the top reflector, $\phi_{r,bottom}$ is the phase shift of the phase shift upon reflection of the light from the bottom reflector, and $2\int k(z)dz$ is the phase accumulation from the light propagating through the optical cavity. In some embodiments, meta-reflector(s) can be used as the top reflector and/or the bottom reflector to produce a desired $\phi_{r,top}$ and/or $\phi_{r,bottom}$.

In some embodiments, the meta-reflector layer 412 can have a geometry so that the above resonance condition is only valid for a given range of wavelengths of light and for a particular polarization state (linear, circular, or elliptical). Example geometries of meta-reflectors are discussed in greater detail below in conjunction with FIGS. 5, 6A-B, and 7A-D. When the resonance condition is only valid for a given range of wavelengths of light and for a particular polarization state, the phase shift upon reflection from the meta-reflector layer 412 can be highly dispersive (wavelength dependent) and polarization sensitive. Such wavelength and polarization sensitivity can lead to output efficiency of a dipole emission within the EL light source 408 in the particular range of wavelengths and the particular polarization state to be significantly (e.g., greater than 100 percent) better than that at other wavelengths and polarization states.

In some embodiments, the meta-reflector 412 can provide a phase of the reflection coefficient because a lateral (transverse) geometry of the meta-reflector 412 is polarization dependent and (optionally) wavelength dependent. Meta-reflectors for different wavelengths of light (e.g., wavelengths corresponding to red, greed, and blue light) can be fabricated by changing the transverse geometry of those meta-reflectors when the meta-reflectors are wavelength dependent.

Figure 5:
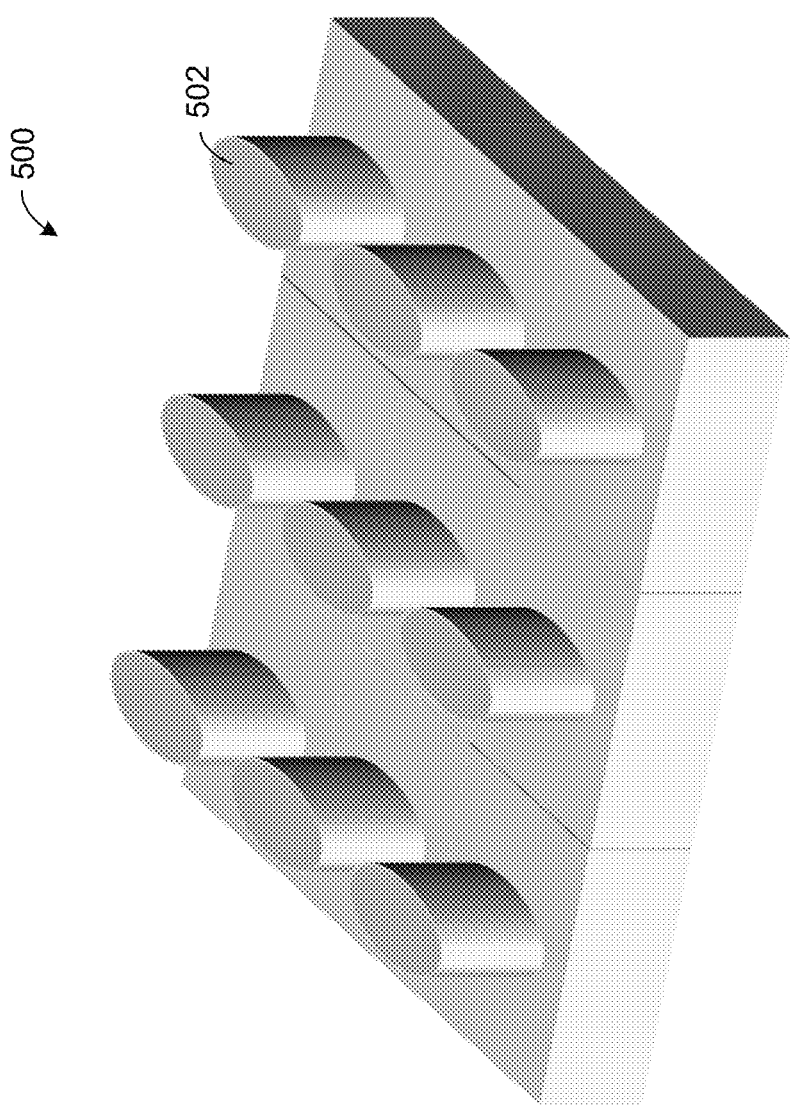
FIG. 5 illustrates an exemplar meta-reflector, according to various embodiments.

FIG. 5 illustrates the geometry of an exemplar meta-reflector 500 that can be used as the meta-reflector 412 of FIG. 4, according to various embodiments. As shown, the meta-reflector 500 includes an array of anisotropic-shaped nanopillars 502. Each of the nanopillars 502 is a three-dimensional or quasi-three-dimension (e.g., two-dimensional shapes with a slight change in the vertical direction) nano-structure that permits the optical cavity within the display element 400 to exhibit a desired optical resonance. In some embodiments, the nano-structures can be manufactured from metal (e.g., Ag, Al, MgAg, LiF/Al, etc.), dielectric, or semiconductor materials, or a combination of multiple materials. Due to the anisotropic shape of the nanopillars 502, light that is polarized along one axis (e.g., the x axis) is reflected with a different phase shift than light that is polarized along an orthogonal axis (e.g., the y axis) by the meta-reflector 500. Exemplar anisotropic shapes for nanopillars of a meta-reflector are described in greater detail below in conjunction with FIGS. 6A-B.

Although anisotropic-shaped nanopillars are shown for illustrative purposes, in some embodiments, a meta-reflector 500 can include chiral-shaped nanopillars that cause light having one handedness of polarization to be reflected with a different phase shift than light having an opposite handedness of polarization. Exemplar chiral shapes for nanopillars of a meta-reflector are described in greater detail below in conjunction with FIGS. 7A-D. In some embodiments, a meta-reflector can include both anisotropic- and chiral-shape nanopillars to reflect arbitrary polarizations of light, such as elliptically polarized light.

In some embodiments, a meta-reflector can include anisotropic- and/or chiral-shape nanopillars that are further shaped so as to reflect light at certain angles. For example, in some embodiments, the profiles of the nanopillars can not be flat. In such cases, a meta-reflector can cause light to be emitted by a display element within a particular range of angles. That is, the reflection properties of each meta-reflector (which can include multiple nanostructures) corresponding to a pixel or sub-pixel can be configured to tailor the light emission angular profile of that pixel or sub-pixel.

Figure 6A:
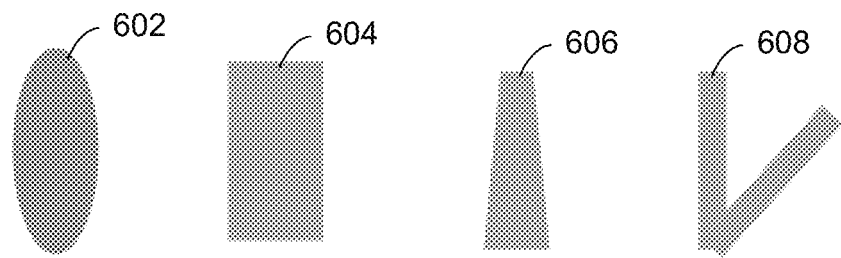
FIGS. 6A-B illustrate top-down views of exemplar shapes of nanopillars in a meta-reflector, according to various embodiments.
Figure 6B:
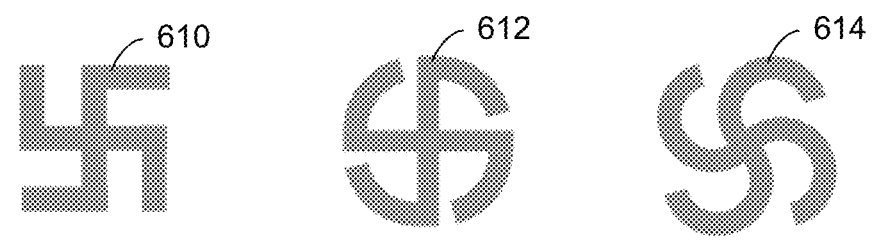

FIGS. 6A-B illustrate top-down views of exemplar shapes of nanopillars in a meta-reflector, according to various embodiments. FIG. 6A illustrates anisotropic-shaped nanopillars 602, 604, 606, and 608. As shown, the anisotropic-shaped nanopillars 602, 604, 606, and 608 are not symmetrical along two orthogonal axis (e.g., the x and y axes). As described, the anisotropic-shaped nanopillars 602, 604, 606, and 608 cause light that is polarized along one axis (e, the x axis) and within a range of wavelengths to be reflected with different phase shifts than light that is polarized along an orthogonal axis (e.g., the y axis) and other wavelengths by a meta-reflector that includes the nanopillars 602, 604, 606, and 608. Although particular anisotropic shapes are shown for illustrative purposes, any technically-feasible anisotropic shapes (e.g., rectangular shapes) for nanopillars can be used in some embodiments.

FIG. 6B illustrates top-down views of chiral-shaped nanopillars 610, 612, and 614. As shown, the chiral-shaped nanopillars 610, 612, and 614 are not mirror symmetric. The chiral-shaped nanopillars 610, 612, and 614 cause light having one handedness of polarization (e.g., left and right circular polarized light) and within a range of wavelengths to be reflected with different phase shifts than light having an opposite handedness of polarization and other wavelengths by a meta-reflector that includes the nanopillars 610, 612, and 614. Although particular chiral shapes are shown for illustrative purposes, any technically-feasible chiral shapes for nanopillars can be used in some embodiments. It should be noted that meta-reflectors for different wavelengths of light and polarizations can be fabricated through the same process by changing the transverse geometry of the nanopillars, such as those shown in FIGS. 6A-B.

FIGS. 7A-D illustrate cross-section views of exemplar meta-reflectors, according to various other embodiments. In contrast to the meta-reflectors that include nanopillars, described above in conjunction with FIGS. 5 and 6A-B, polarization sensitive meta-reflector can also include an array of anisotropic or chiral-shaped nanostructures embedded within a transversely uniform layer of film or multiple films, or voids in which no material is included in certain shapes within a transversely uniform layer of film or multiple films.

Figure 7A:
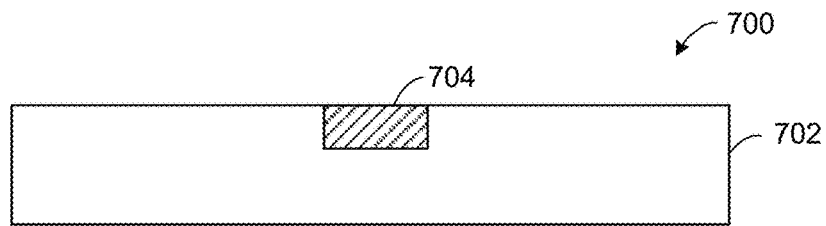
FIGS. 7A-D illustrate cross-section views of exemplar meta-reflectors, according to various embodiments.

As shown in FIG. 7A, in some embodiments, a meta-reflector 700 can include an array of nano-structures, shown as nanostructure 704, that are embedded in a single metallic film 702. The nanostructures can be manufactured from any technically feasible material or materials and have any suitable shape or shapes. For example, in some embodiments, the nanostructures can be manufactured from dielectric or semiconductor materials, or composites thereof, and have the anisotropic and/or chiral shapes described above in conjunction with FIGS. 6A-B. In some embodiments, a meta-reflector can include voids that have similar shapes as the nanostructure shown in FIG. 7A but do not include any materials, as described above.

Figure 7B:
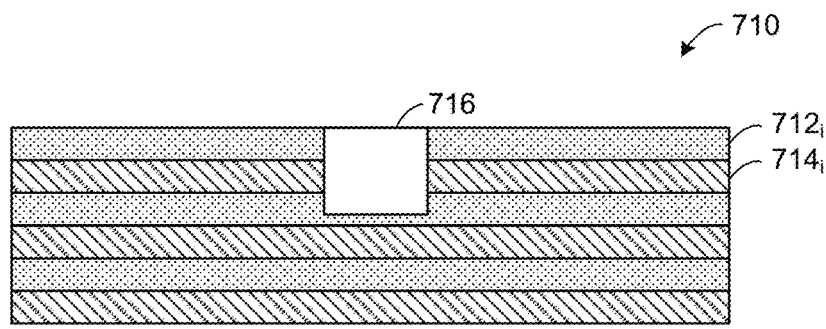

As shown in FIG. 7B, in some embodiments, a meta-reflector 710 can include an array of nano-structures, shown as nanostructure 716, embedded in multiple alternating layers 7121 and 7141 (referred to herein collectively as layers 712 or 714 and individually as a layer 712 or 714) of different materials. The nanostructures and layers 712 and 714 can be manufactured from any technically feasible material, such as metallic, dielectric, or semiconductor materials, or composites thereof. In addition, the nanostructures can have any suitable shape or shapes, such as the anisotropic and/or chiral shapes described above in conjunction with FIGS. 6A-B. In some embodiments, a meta-reflector can include voids that have similar shapes as the nanostructure shown in FIG. 7B but do not include any materials, as described above.

Figure 7C:
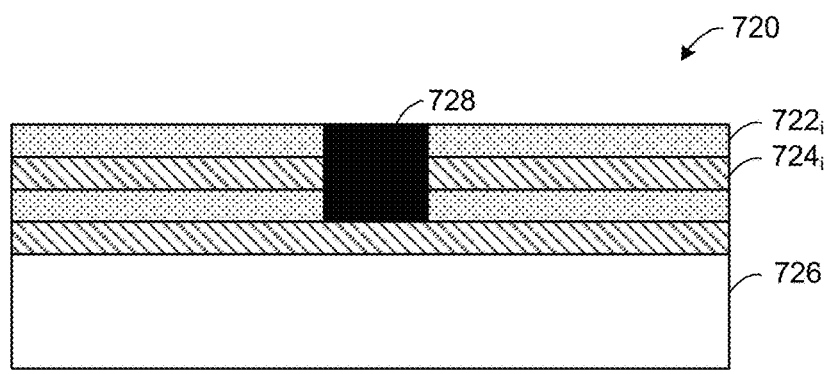

As shown in FIG. 7C, in some embodiments, a meta-reflector 720 can include an array of nano-structures, shown as nanostructure 728, embedded within multiple alternating layers 722 and 724 (referred to herein collectively as layers 722 or 724 and individually as a layer 722 or 724) of different materials that are on top of a metallic film 726. The nanostructures and layers 722 and 724 can be manufactured from any technically feasible material, such as metallic, dielectric, or semiconductor materials, or composites thereof. In addition, the nanostructures can have any suitable shape or shapes, such as the anisotropic and/or chiral shapes described above in conjunction with FIGS. 6A-B. In some embodiments, a meta-reflector can include voids that have similar shapes as the nanostructure shown in FIG. 7C but do not include any materials, as described above.

Figure 7D:
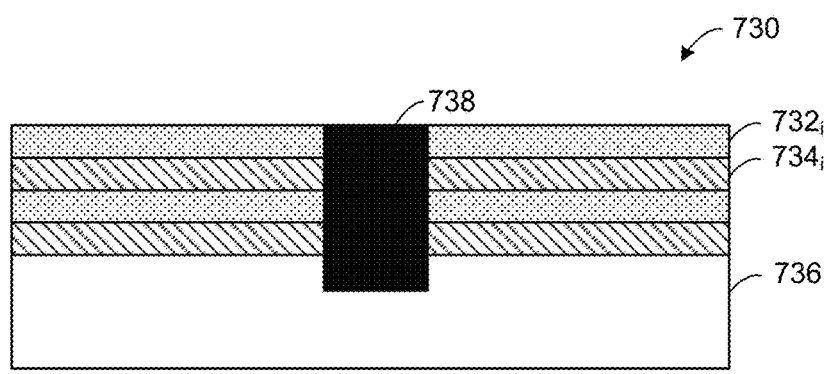

As shown in FIG. 7D, a meta-reflector 730 can include an array of nano-structures, shown as nanostructure 738, embedded within multiple alternating layers 732 and 734 (referred to herein collectively as layers 732 or 734 and individually as a layer 732 or 734) of different materials and a metallic film 736. The components of the meta-reflector 730 are similar to correspondingly numbered components of the meta-reflector 720, described above in conjunction with FIG. 7C, except the nanostructures (e.g., nanostructure 738) in the meta-reflector 730 extend down into the metallic film 736. In some embodiments, a meta-reflector can include voids that have similar shapes as the nanostructure shown in FIG. 7D but do not include any materials, as described above.

Figure 8:
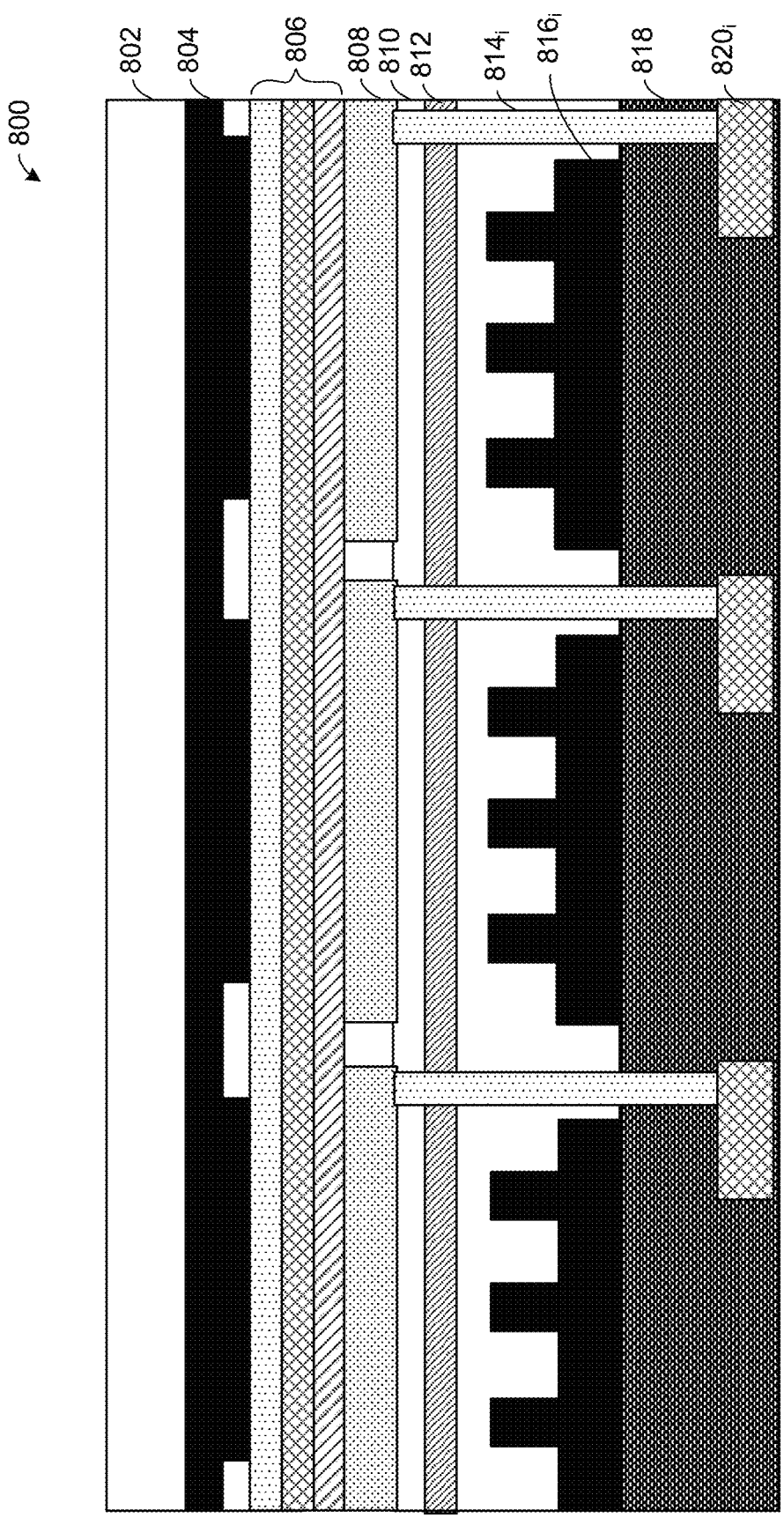
FIG. 8 illustrates a cross-section view of a display device, according to various embodiments.

FIG. 8 illustrates a cross-section view of a display device 800, according to various embodiments. All or some of the components shown in FIG. 8 may be in physical contact with one another, optically in contact with one another, have index matching fluid or optical glue between one another, and/or may have space therebetween.

As shown, the display device 800 includes a cap layer 802, a cathode layer 804, an EL light source 806, a pixelated anode layer 808, a planarization layer 810, an optional waveplate 812, electronic vias 8141 (referred to herein collectively as electronic vias 814 and individually as an electronic via 814), multiple meta-reflectors 8161 (referred to herein collectively as meta-reflectors 816 and individually as a meta-reflector 816), a substrate 818, and electronic circuitry 8201 connected to the electronic vias 814 (referred to herein collectively as electronic circuitry 820 and individually as an electronic circuitry 820), which may be constructed from any technically feasible materials and have any suitable size. The EL light source 806, the pixelated anode layer 808, the planarization layer 810, the meta-reflectors 816, and the substrate 818 are similar to the cap layer 402, the cathode layer 404, the EL light source 406, the anode layer 408, the planarization layer 410, the meta-reflector layer 412, and the substrate 414, respectively, that are described above in conjunction with FIG. 4.

The electronic circuitry 820 is connected to the pixelated anode layer 808 by the electronic vias 814 is used to drive the pixelated anode layer 808, causing a portion of the EL light source 806 corresponding to a pixel (or sub-pixel) to either emit light or to not emit light. The electronic vias 814 can be, . . . , metallic vias in some embodiments. As described, the EL light source 806 can include stacked unpatterned EL material layers for different colors (e . . . , red, green, and blue), and each color pixel (or subpixel) is defined by the pixelated anode layer 808 that is connected to the electronic circuitry 820 in the substrate 818 through electronic vias 814. Light emitted by the EL light source 806 is reflected within an optical cavity formed by the cathode layer 804 and the meta-reflectors 816, which enhances the emission of light having a particular polarization and within a particular range of wavelengths, depending on the type of meta-reflectors 816 that are used. In some embodiments, the meta-reflectors 816 can include one or more of the exemplar meta-reflectors described above in conjunction with FIGS. 5, 6A-B, and 7A-D. In some embodiments, the sub-pixels within a pixel can include meta-reflectors 816 that have different transverse geometries and cause different ranges of wavelengths of light corresponding to different colors (e.g., red, green, and blue) to be resonant. For example, in the case of meta-reflectors that include an array of nanopillars, the nanopillars in different sub-pixels can have different transverse geometries but the same height. Further, in some embodiments different groups of pixels and/or sub-pixels can be configured to produce output light of different polarization states, which can enable polarization multiplexing. For example, some pixel could be x polarized and other pixels could be y polarized. In addition, in some embodiments, the voids between nanopillars of the meta-reflectors 816 can be filled with, (e.g., a liquid crystal material that can be switched to change the resonance condition, thereby permitting active control of the polarization and/or range of wavelengths of light that emitted by a pixel or sub-pixel.

The waveplate 812 is an optional optical element that adjusts the polarization state of light that is output by the display device 800. In some embodiments, the waveplate 812 can be used to control the wavelength of light, which can in turn transform the output light from one polarization state to another. For example, if the meta-reflectors 816 are chiral meta-reflector 816 that reflect circularly polarized light, the waveplate 812 can be used to transform the circularly polarized light into linearly polarized light. Any suitable type of waveplate can be used, such as a quarter-waveplate, a half-waveplate, or an arbitrary waveplate, in some embodiments. Although shown as being included within the display device 800, a waveplate and/or other optical elements (e.g., polarizers) can instead be placed external to a display device in some embodiments.

In some embodiments, a display device can include a waveplate that is disposed between flat reflectors (i.e., reflectors that are not meta-reflectors or polarization sensitive). In such cases, resonant conditions within an optical cavity formed between the reflectors may only exist for one polarization of light if the waveplate has a polarization-sensitive path length. Further, the waveplate can be highly anisotropic to minimize a thickness of the waveplate. For example, the waveplate could be a subwavelength grating manufactured from a polymer or organic solid crystal material.

Figure 9A:
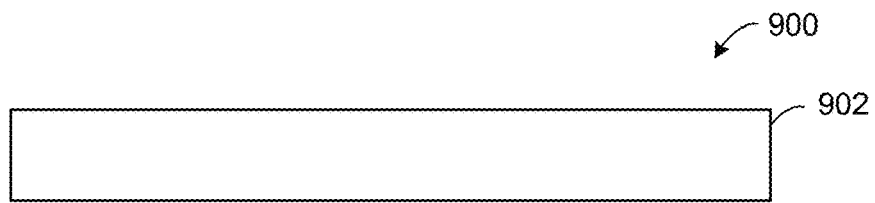
FIGS. 9A-D illustrate cross-section views of exemplar reflectors that can be included in the display device of FIG. 8, according to various embodiments.
Figure 9B:
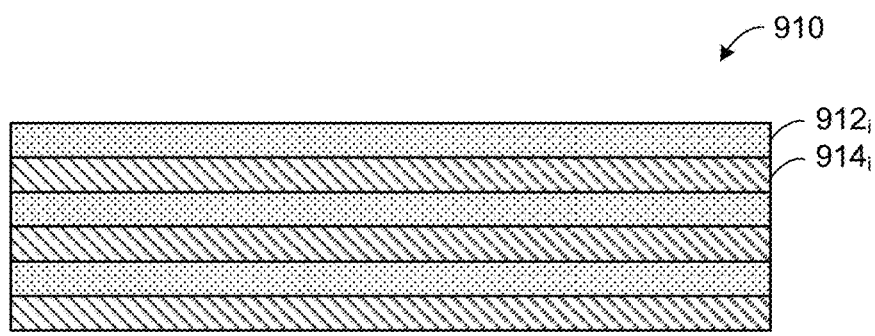
Figure 9C:
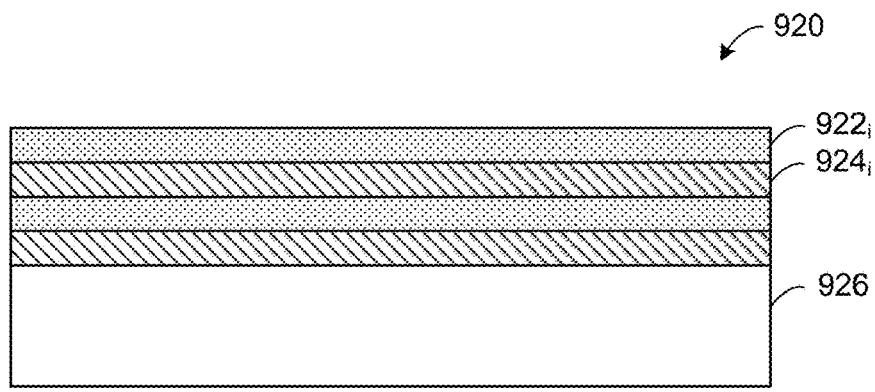

FIGS. 9A-C illustrate cross-section views of exemplar reflectors that can be used as the cathode layer 804 in the display device 800 of FIG. 8, according to various embodiments. As shown in FIG. 9A, a reflector 900 can include a single metallic film 902 in some embodiments. Alternatively, the reflector 900 can include a dielectric or semiconducting material in some embodiments. As shown in FIG. 9B, a reflector 910 can include multiple alternating layers 9121 and 9141 (referred to herein collectively as layers 912 or 914 and individually as a layer 912 or 914) of different materials that in combination produce a relatively high reflection. Any technically feasible materials can be used in the layers 912 and 914, such as metallic, dielectric, or semiconductor materials, or composites thereof. As shown in FIG. 9C, a reflector 920 can include multiple alternating layers 922 and 924 (referred to herein collectively as layers 922 or 924 and individually as a layer 922 or 924) of different materials (e.g., metallic, dielectric, or semiconductor materials, or composites thereof) as well as a metallic film 916, in some other embodiments.

Figure 9D:
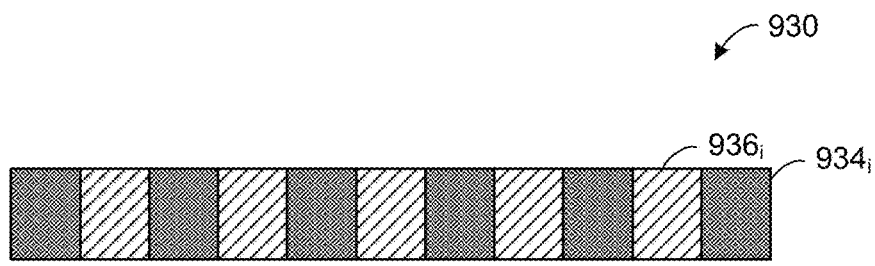

FIG. 9D illustrates a cross-section view of an exemplar grating layer 930 that can be used as one of the layers 912, 914, 922, or 924 in the reflectors 910 or 920 of FIG. 9B and FIG. 9C, according to various embodiments. As shown, the grating layer 930 can include a one-dimensional or two-dimensional grating layer, shown as a structured composite material formed from alternating constituent materials 9341 and 9361 that exhibit a substantially uniform optical property. In some other embodiments, a grating layer can include a random (rather than a structured) composite material made of two or more constituents material that exhibit uniform optical property. Any technically feasible materials can be used, such as dielectric or semiconductor materials, or composites thereof. In some embodiments, the grating of the reflector 930 is a high-index-contrast grating having a subwavelength pitch so that light incident on the reflector 930 is uniformly reflected by the grating.

Figure 10A:
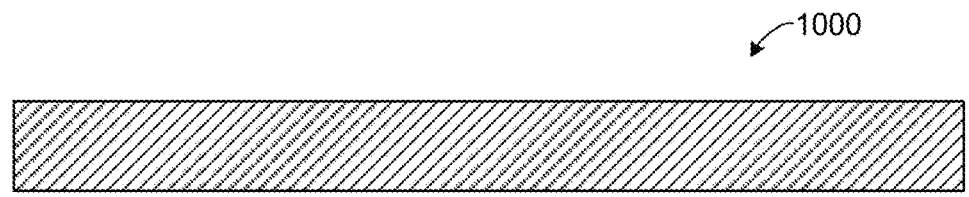
FIGS. 10A-D illustrate cross-section views of additional exemplar reflectors that can be included in the display device of FIG. 8, according to various embodiments.
Figure 10B:
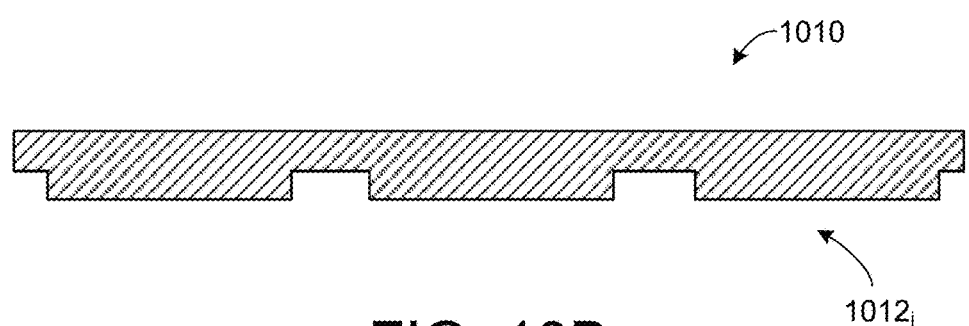

FIGS. 10A-D illustrate cross-section views of additional exemplar reflectors that can be used as the cathode layer 804 in the display device 800 of FIG. 8, according to various embodiments. As shown in FIG. 10A, a reflector 1000 includes a substantially uniform metallic film in some embodiments. As shown in FIG. 10B, a reflector 1010 includes a metallic film that includes pixel contacts 10121 (referred to herein collectively as pixel contacts 1012 and individually as a pixel contact 1012). The pixel contacts 1012 can improve current confinement when the cathode 804 is being driven by the electronic circuitry 820. As a result, the optical cavity effect can be stronger at a center of a pixel or sub-pixel than at edges of the pixel or sub-pixel.

Figure 10C:
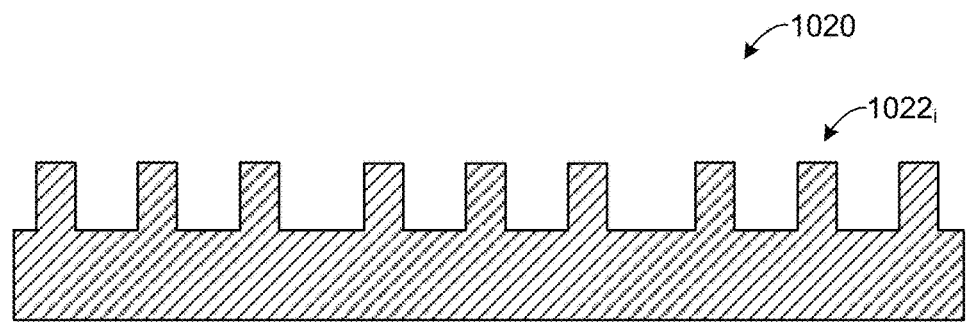

As shown in FIG. 10C, a reflector 1020 includes a substantially uniform metallic film and nanostructures 10221 (referred to herein collectively as nanostructures 1022 and individually as a nanostructure 1022), in some embodiments. The nanostructures 1022 can achieve desired wavelength and polarization dependent reflection amplitude/phase through the geometry and material design of the nanostructures 1022. In some embodiments, the nanostructures 1022 can be manufactured from the same metallic material as the uniform metallic film.

Figure 10D:
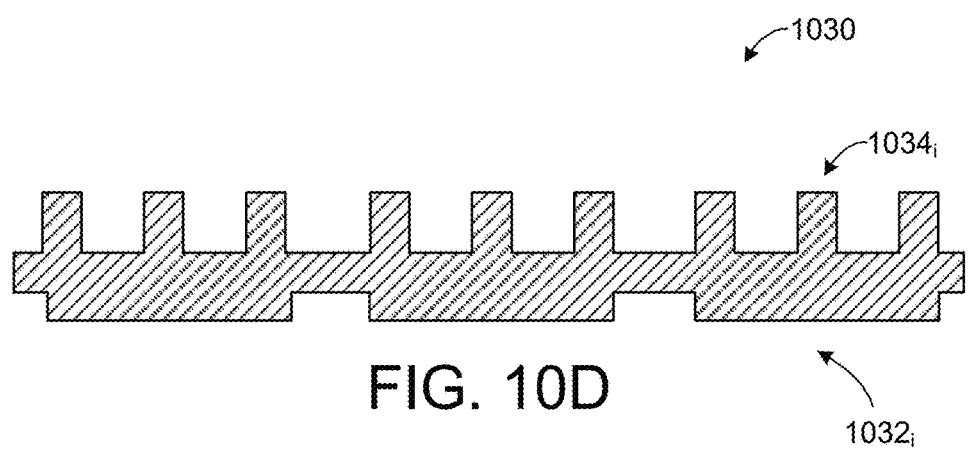

As shown in FIG. 10D, a reflector 1030 includes a metallic film with pixel contacts 10321 (referred to herein collectively as pixel contacts 1032 and individually as a pixel contact 1032), as well as nanostructures 10341 (referred to herein collectively as nanostructures 1034 and individually as a nanostructure 1034), in some embodiments. The pixel contacts 1032 are similar to the pixel contacts 1012 described above in conjunction with FIG. 10B, and the nanostructures 1034 are similar to the nanostructures 1022 described above in conjunction with FIG. 10C.

FIGS. 11A-F illustrate cross-section views of exemplar combinations of reflectors and cathodes that can be used as the cathode layer 804 in the display device 800 of FIG. 8, according to various embodiments. All or some of the components shown in FIGS. 11A-F may be in physical contact with one another, optically in contact with one another, have index matching fluid or optical glue between one another, and/or may have space therebetween.

Figure 11A:
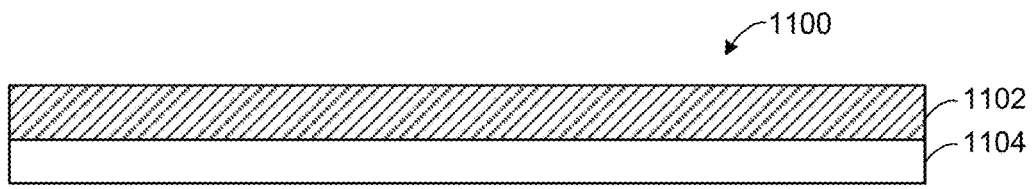
FIGS. 11A-F illustrate cross-section views of additional exemplar reflectors that can be included in the display device of FIG. 8, according to various embodiments.

As shown in FIG. 11A, a reflector 1102 that includes a substantially uniform metallic film is separate from a cathode layer 1104 in some embodiments. The reflector 1102 is similar to the reflector 1000, described above in conjunction with FIG. 10A, except the reflector 1102 is not used as a cathode. In some embodiments, the cathode layer 1104 is constructed from a different material (e.g., an optically transparent conducting material) than the reflector 1102.

Figure 11B:
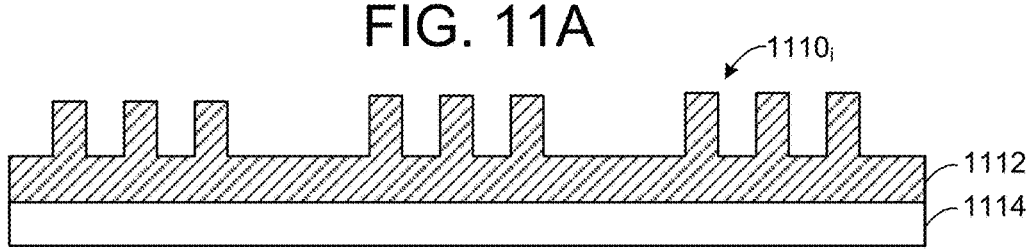

As shown in FIG. 11B, a reflector 1112, which includes a substantially uniform metallic film and nanostructures 11101 (referred to herein collectively as nanostructures 1110 and individually as a nanostructure 1110), is separate from a cathode layer 1114 in some embodiments. The reflector 1112 is similar to the reflector 1020, described above in conjunction with FIG. 10C, except the reflector 1112 is not used as a cathode. In some embodiments, the cathode layer 1114 is constructed from a different material (e.g., an optically transparent conducting material) than the reflector 1112.

Figure 11C:
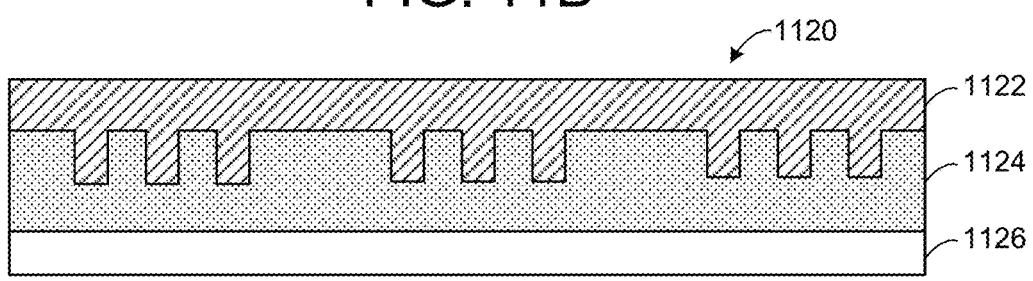

As shown in FIG. 11C, a reflector 1122 that includes a substantially uniform metallic film and nanostructures 11201 is separated from a cathode layer 1126 by a planarization material layer 1124 in some embodiments. The reflector 1122 is similar to the reflector 1112, described above in conjunction with FIG. 11B, except the nanostructures 1120 protrude from the reflector 1122 in a direction facing the cathode 1126, and the reflector 1122 is separated from the cathode layer 1126 by the planarization material layer 1124.

Figure 11D:
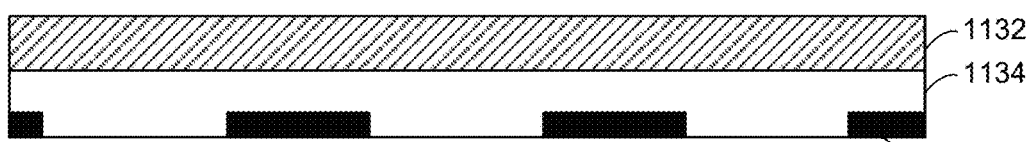

As shown in FIG. 11D, a reflector 1132 that includes a substantially uniform metallic film is separate from a cathode layer 1134 that includes black matrix materials 10361 (referred to herein collectively as black matrix materials 1036 and individually as a black matrix material 1036). The reflector 1132 and the cathode layer 1134 are similar to the reflector 1102 and the cathode layer 1104, respectively, described above in conjunction with FIG. 11A, except the cathode layer 1134 also includes black matrix materials 1036 to block light from propagating through spaces between pixels.

Figure 11E:

As shown in FIG. 11E, a reflector 1142, which includes a substantially uniform metallic film and nanostructures 11401 (referred to herein collectively as nanostructures 1140 and individually as a nanostructure 1140), is separate from a cathode layer 1144 that includes black matrix materials 10461 (referred to herein collectively as black matrix materials 1046 and individually as a black matrix material 1046)

in some embodiments. The reflector 1142 and the cathode layer 1144 are similar to the reflector 1112 and the cathode layer 1114, respectively, described above in conjunction with FIG. 11B, except the cathode layer 1144 also includes black matrix materials 1046 to block light from propagating through spaces between pixels.

Figure 11F:
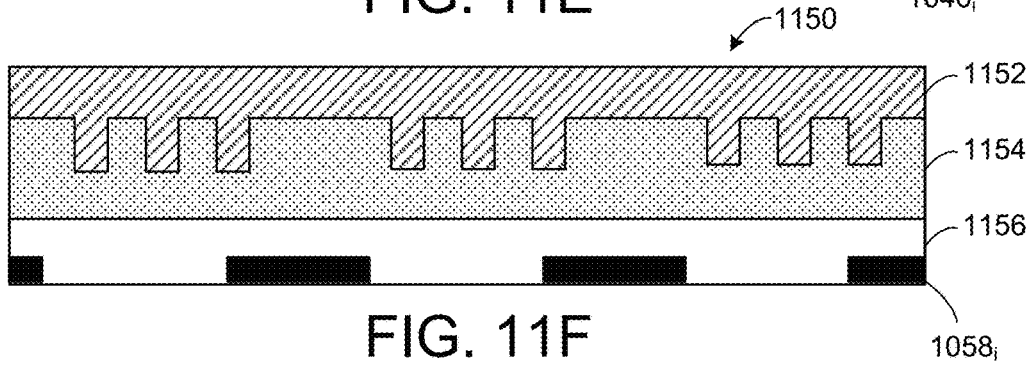

As shown in FIG. 11F, a reflector 1152 that includes a substantially uniform metallic film and nanostructures 11501 is separated from a cathode layer 1156 that includes black matrix materials 10581 (referred to herein collectively as black matrix materials 1058 and individually as a black matrix material 1058) by a planarization material layer 1154. The reflector 1152, the planarization material layer 1154, and the cathode layer 1156 are similar to the reflector 1122, the planarization material layer 1124, and the cathode layer 1126, respectively, described above in conjunction with FIG. 11C, except the cathode layer 1156 includes some black matrix material to block light from propagating through spaces between pixels.

Figure 12:
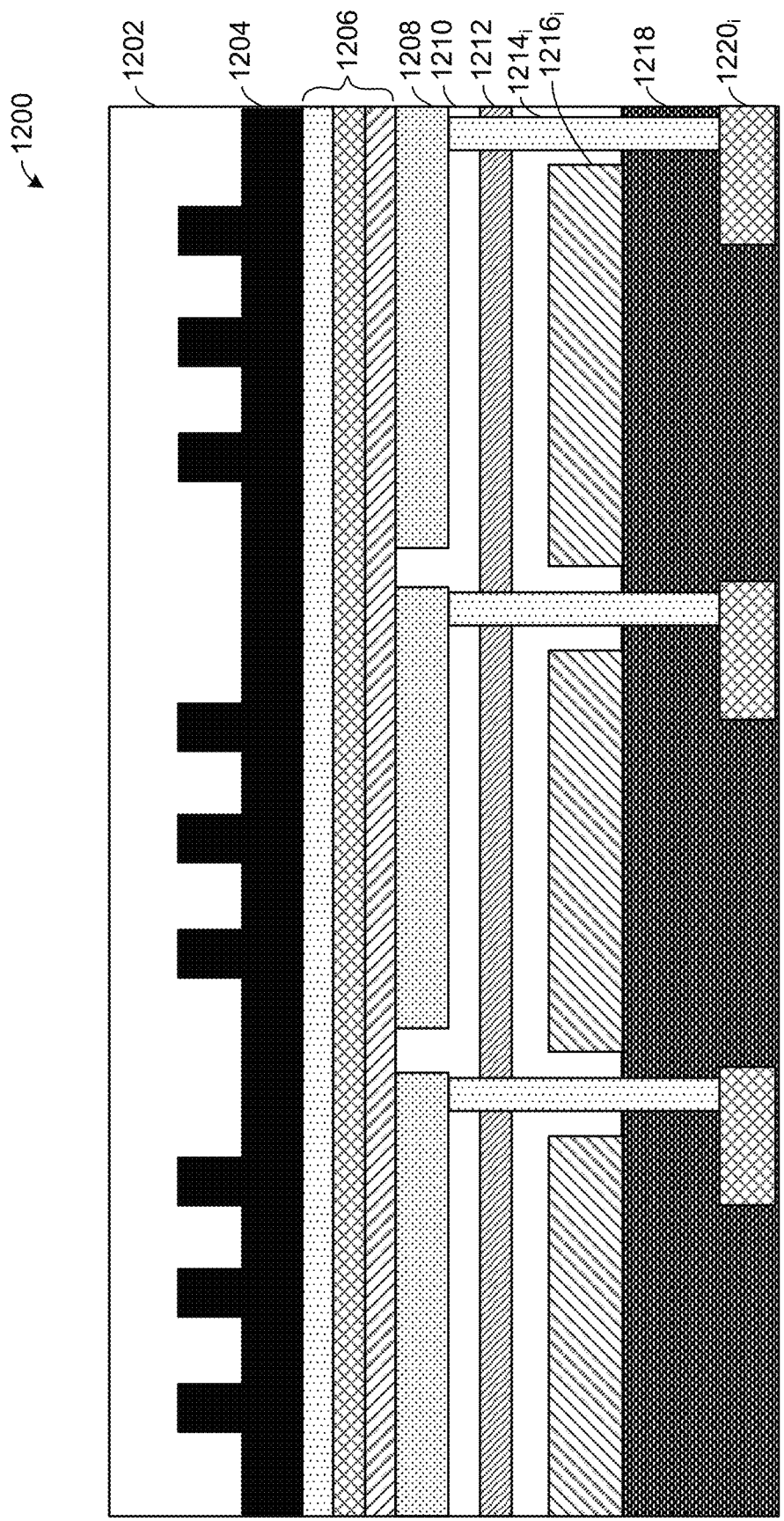
FIG. 12 illustrates a cross-section view of a display device, according to various other embodiments.

FIG. 12 illustrates a cross-section view of a display device 1200, according to various other embodiments. All or some of the components shown in FIG. 12 may be in physical contact with one another, optically in contact with one another, have index matching fluid or optical glue between one another, and/or may have space therebetween.

As shown, the display device 1200 includes a cap layer 1202, a meta-reflector layer 1204, an EL light source 1206, a pixelated anode layer 1208, a planarization layer 1210, an optional waveplate 1212, electronic vias 12141 (referred to herein collectively as electronic vias 1214 and individually as an electronic via 1214), multiple bottom reflectors 12161 (referred to herein collectively as bottom reflectors 1216 and individually as a bottom reflector 1216), a substrate 1218, and electronic circuitry 12201 connected to the electronic vias 1214 (referred to herein collectively as electronic circuitry 1220 and individually as an electronic circuitry 1220), which may be constructed from any technically feasible materials and have any suitable size. The cap layer 1202, the EL light source 1206, the pixelated anode layer 1208, the planarization layer 1210, the optional waveplate 1212, the electronic vias 1214, the substrate 1218, and the electronic circuitry 1220 are similar to the cap layer 802, the EL light source 806, the pixelated anode layer 808, the planarization layer 810, the optional waveplate 812, the electronic vias 814, the substrate 818, and the electronic circuitry 820, respectively, that are described above in conjunction with FIG. 8.

However, the display device 1200 includes the meta-reflector layer 1204 that is the top partial reflector and used as the common cathode, as well as the bottom reflectors 1216 that are not meta-reflectors. That is, the meta-reflector layer 1204 can be above the EL light source (shown as EL light source 1206) and used as the common cathode and partial reflector, rather than below the EL light source and used as a full reflector, as shown in FIG. 8. In some embodiments, the bottom reflectors 1216 can be constructed from single or multi-layer films of metal, dielectric, and/or composite materials.

Figure 13:
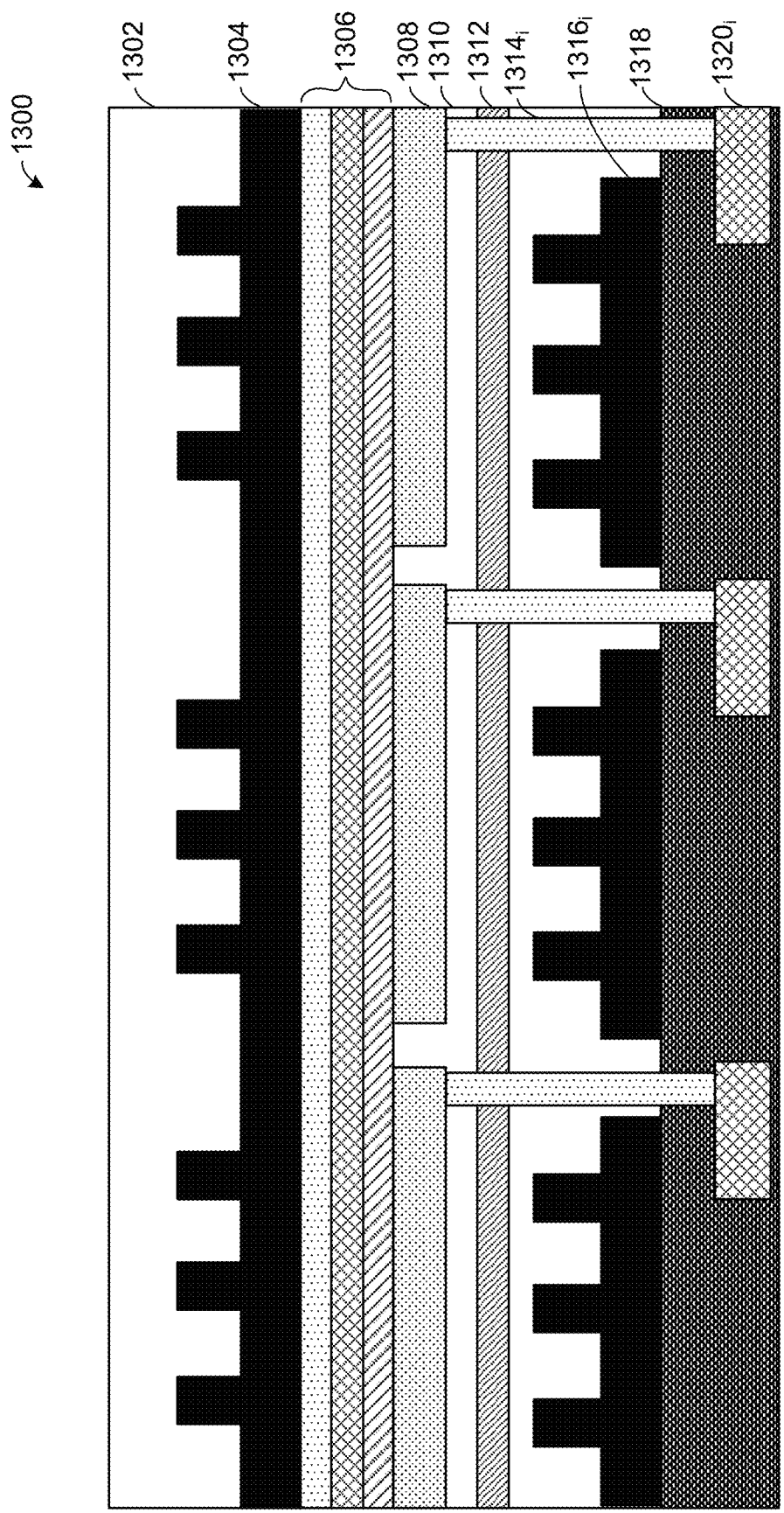
FIG. 13 illustrates a cross-section view of a display device, according to various other embodiments.

FIG. 13 illustrates a cross-section view of a display device 1300, according to various other embodiments. All or some of the components shown in FIG. 13 may be in physical contact with one another, optically in contact with one another, have index matching fluid or optical glue between one another, and/or may have space therebetween.

As shown, the display device 1300 includes a cap layer 1302, a meta-reflector layer 1304, an EL light source 1306, a pixelated anode layer 1308, a planarization layer 1310, an optional waveplate 1312, electronic vias 13141 (referred to herein collectively as electronic vias 1314 and individually as an electronic via 1314), multiple bottom meta-reflectors 13161 (referred to herein collectively as meta-reflectors 1316 and individually as a meta-reflector 1316), a substrate 1318, and electronic circuitry 13201 connected to the electronic vias 1314 (referred to herein collectively as electronic circuitry 1320 and individually as an electronic circuitry 1320), which may be constructed from any technically feasible materials and have any suitable size. The cap layer 1302, the EL light source 1306, the pixelated anode layer 1308, the planarization layer 1310, the optional waveplate 1312, the electronic vias 1314, the substrate 1318, and the electronic circuitry 1320 are similar to the cap layer 802, the EL light source 806, the pixelated anode layer 808, the planarization layer 810, the optional waveplate 812, the electronic vias 814, the substrate 818, and the electronic circuitry 820, respectively, that are described above in conjunction with FIG. 8.

However, the display device 1300 includes the meta-reflector layer 1304 at the top that is a partial reflector and used as the common cathode, as well as the meta-reflectors 1316 at the bottom. That is, meta-reflector layers 1304 and 1316 can be used as both the cathode and partial reflector above the EL light source (shown as EL light source 1306) as well as the full reflector below the EL light source, rather than only below the EL light source as a full reflector, as shown in FIG. 8.

Figure 14:
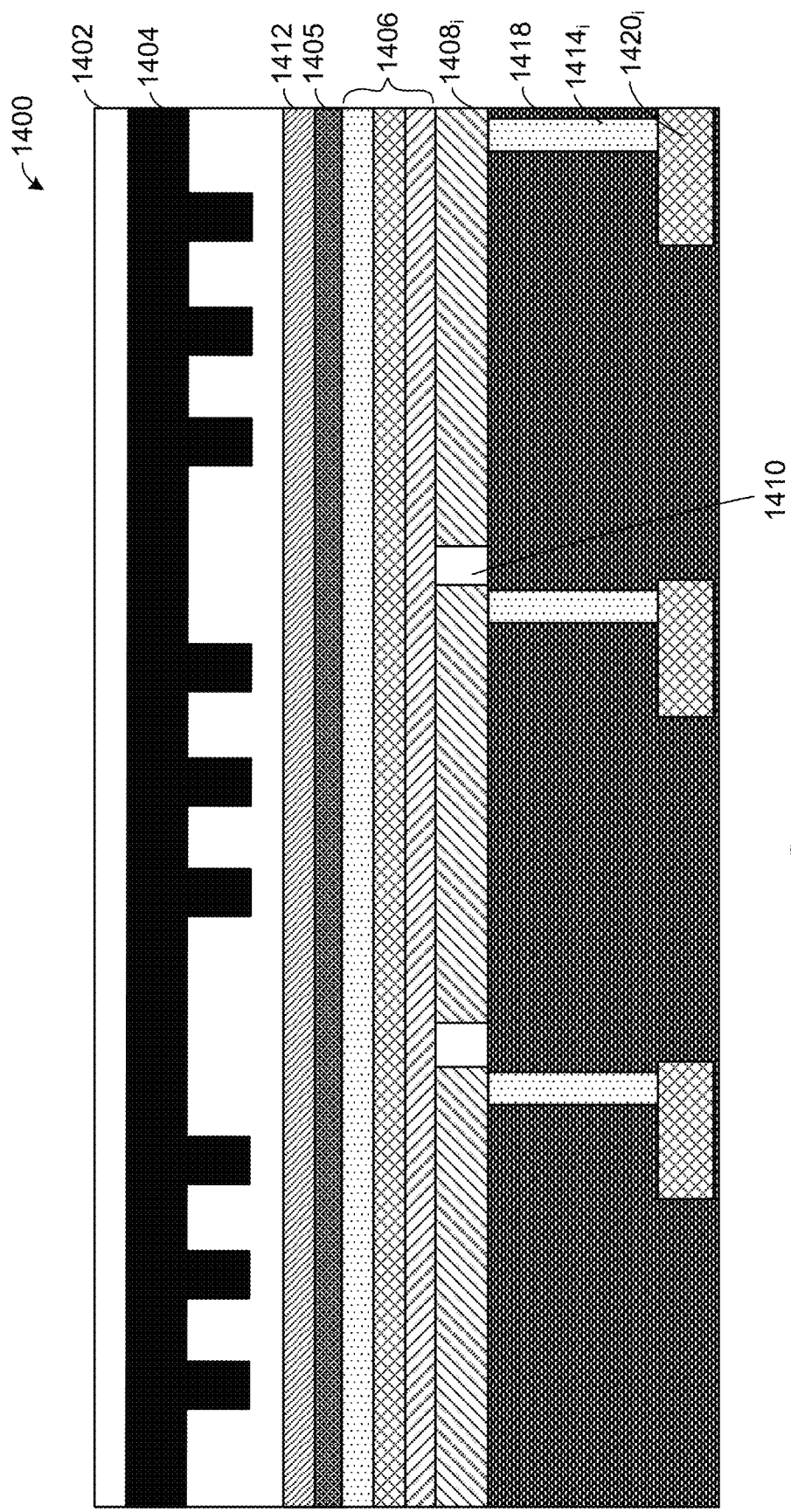
FIG. 14 illustrates a cross-section view of a display device, according to various other embodiments.

FIG. 14 illustrates a cross-section view of a display device 1400, according to various other embodiments. All or some of the components shown in FIG. 14 may be in physical contact with one another, optically in contact with one another, have index matching fluid or optical glue between one another, and/or may have space therebetween.

As shown, the display device 1400 includes a cap layer 1402, a meta-reflector layer 1404, an optional waveplate 1412, a common anode layer 1405, an EL light source 1406, multiple bottom reflectors 14081 (referred to herein collectively as bottom reflectors 1408 and individually as a bottom reflector 1408) that act as a pixelated anode layer, a planarization layer 1410, electronic vias 14141 (referred to herein collectively as electronic vias 1414 and individually as an electronic via 1414), a substrate 1418, and electronic circuitry 14201 connected to the electronic vias 1414 (referred to herein collectively as electronic circuitry 1420 and individually as an electronic circuitry 1420), which may be constructed from any technically feasible materials and have any suitable size. The cap layer 1402, the EL light source 1406, the planarization layer 1410, the optional waveplate 1412, the electronic vias 1414, the substrate 1418, and the electronic circuitry 1420 are similar to the cap layer 1202, the EL light source 1206, the planarization layer 1210, the optional waveplate 1212, the electronic vias 1214, the substrate 1218, and the electronic circuitry 1220, respectively, that are described above in conjunction with FIG. 12.

However, the display device 1400 includes the common anode layer 1405, which can be an optically transparent conducting material that is separate from the meta-reflector 1404 and is used as a common cathode, similar to the description above in conjunction with FIGS. 11C and 11F. The meta-reflector 1404 is backward relative to the meta-reflector 1204 of FIG. 12. The common anode layer 1405 is used to ensure a substantially uniform contact with the EL light source 1410, because the side of the meta-reflector 1404 facing the EL light source 1410 is non-uniform. In addition, in the display device 1400, the bottom reflectors 1408 act as the pixelated anode that is electrically connected to electronic circuitry 1420 through the electronic vias 1418.

Figure 15:
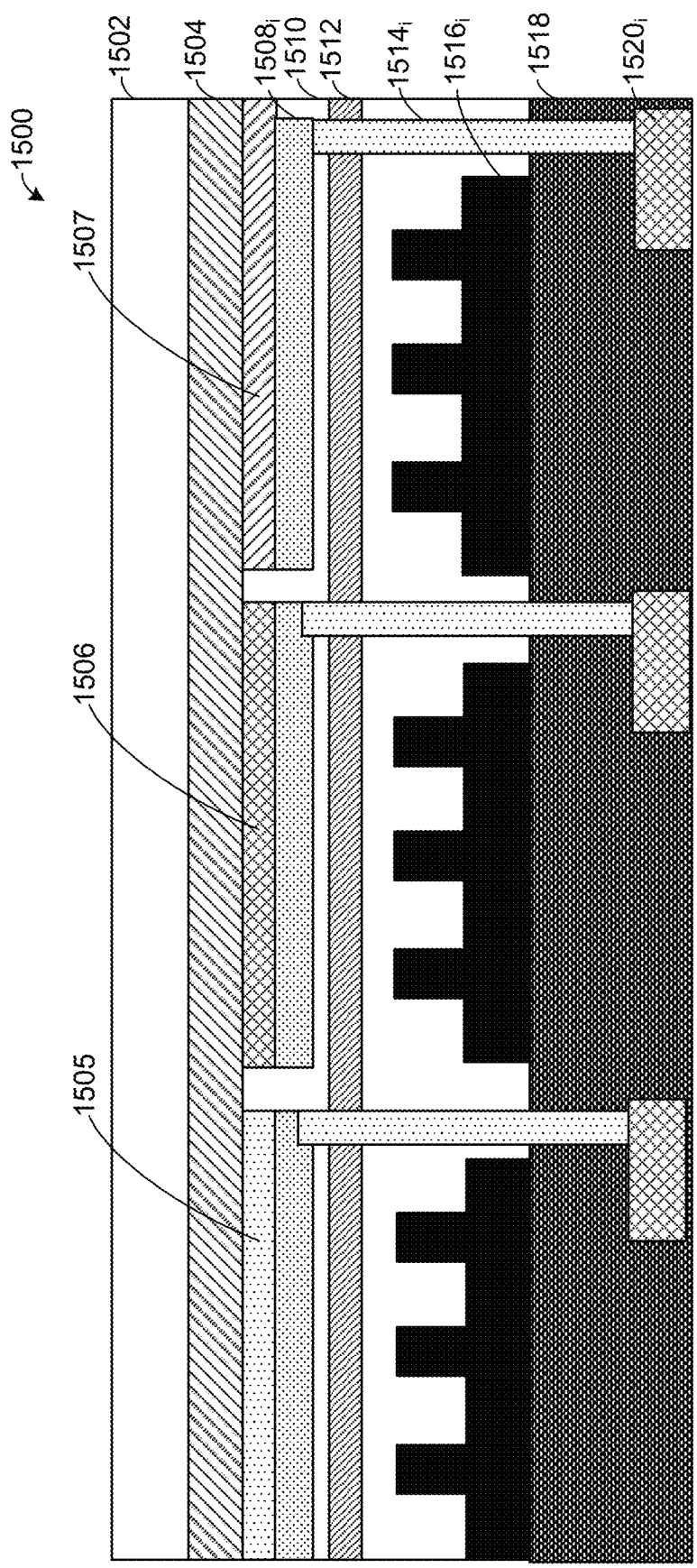
FIG. 15 illustrates a cross-section view of a display device, according to various other embodiments.

FIG. 15 illustrates a cross-section view of a display device 1500, according to various other embodiments. All or some of the components shown in FIG. 15 may be in physical contact with one another, optically in contact with one another, have index matching fluid or optical glue between one another, and/or may have space therebetween.

As shown, the display device 1500 includes a cap layer 1502, a cathode layer 1504, EL layers 1505, 1506, and 1507, a pixelated anode layer 1508, a planarization layer 1510, an optional waveplate 1512, electronic vias 15141 (referred to herein collectively as electronic vias 1514 and individually as an electronic via 1514), multiple meta-reflectors 15161 (referred to herein collectively as meta-reflectors 1516 and individually as a meta-reflector 1516), a substrate 1518, and electronic circuitry 15201 connected to the electronic vias 1514 (referred to herein collectively as electronic circuitry 1520 and individually as an electronic circuitry 1520), which may be constructed from any technically feasible materials and have any suitable size. The cap layer 1502, the cathode layer 1504, the pixelated anode layer 1508, the planarization layer 1510, the optional waveplate 1512, the electronic vias 1514, the meta-reflectors 1516, the substrate 1518, and the electronic circuitry 1520 are similar to cap layer 802, the cathode layer 804, the pixelated anode layer 808, the planarization layer 810, the optional waveplate 812, the electronic vias 814, the meta-reflectors 816, the substrate 818, and the electronic circuitry 820, respectively, that are described above in conjunction with FIG. 8.

However, the display device 1500 includes separate layers of EL materials, shown as the EL layers 1505, 1506, and 1507, for different colors of light (e.g., red, green, and blue). In some embodiments, each separate EL layer 1505, 1506, or 1507 corresponds to a color pixel or sub-pixel that includes an EL material layer and optional carrier transport and blocking layers in some embodiments.

Figure 16:
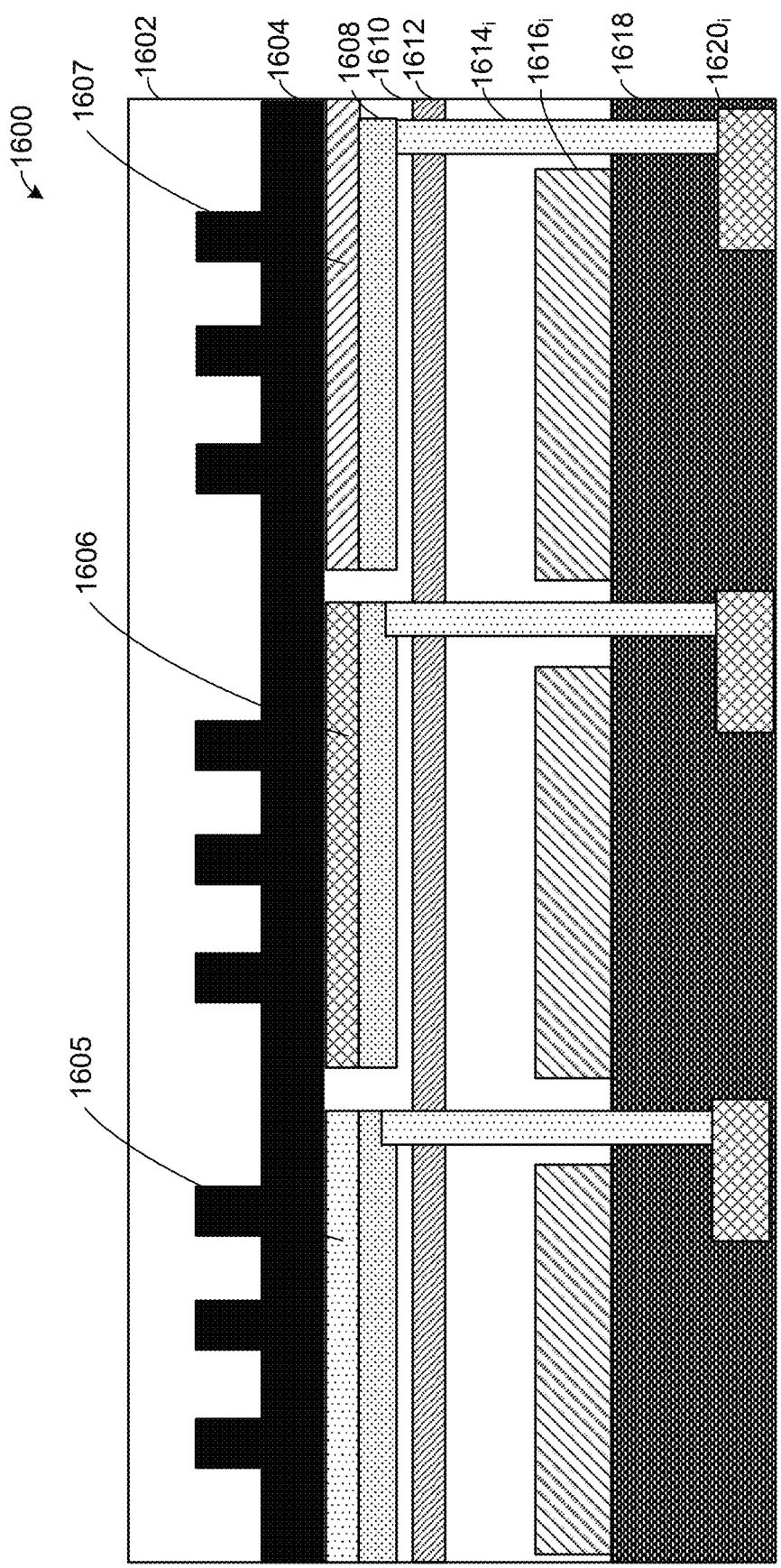
FIG. 16 illustrates a cross-section view of a display device, according to various other embodiments.

FIG. 16 illustrates a cross-section view of a display device 1600, according to various other embodiments. All or some of the components shown in FIG. 16 may be in physical contact with one another, optically in contact with one another, have index matching fluid or optical glue between one another, and/or may have space therebetween.

As shown, the display device 1600 includes a cap layer 1602, a meta-reflector layer 1604, EL layers 1605, 1606, and 1607, a pixelated anode layer 1608, a planarization layer 1610, an optional waveplate 1612, electronic vias 16141 (referred to herein collectively as electronic vias 1614 and individually as an electronic via 1614), multiple bottom reflectors 16161 (referred to herein collectively as bottom reflectors 1616 and individually as a bottom reflector 1616), a substrate 1618, and electronic circuitry 16201 connected to the electronic vias 1614 (referred to herein collectively as electronic circuitry 1620 and individually as an electronic circuitry 1620), which may be constructed from any technically feasible materials and have any suitable size. The cap layer 1602, the meta-reflector layer 1604, the pixelated anode layer 1608, the planarization layer 1610, the optional waveplate 1612, the electronic vias 1614, the bottom reflectors 1616, the substrate 1618, and the electronic circuitry 1620 are similar to the cap layer 1202, the meta-reflector layer 1204, the pixelated anode layer 1208, the planarization layer 1210, the optional waveplate 1212, the electronic vias 1214, the bottom reflectors 1216, the substrate 1218, and the electronic circuitry 1220, respectively, that are described above in conjunction with FIG. 12.

However, the display device 1600 includes separate layers of EL materials, shown as the EL layers 1605, 1606, and 1607, for different colors of light (e.g., red, green, and blue). Similar to the discussion above in conjunction with FIG. 15, in some embodiments, each separate EL layer 1605, 1606, or 1607 corresponds to a color pixel or sub-pixel that can include an EL material layer and optional carrier transport and blocking layers.

Figure 17:
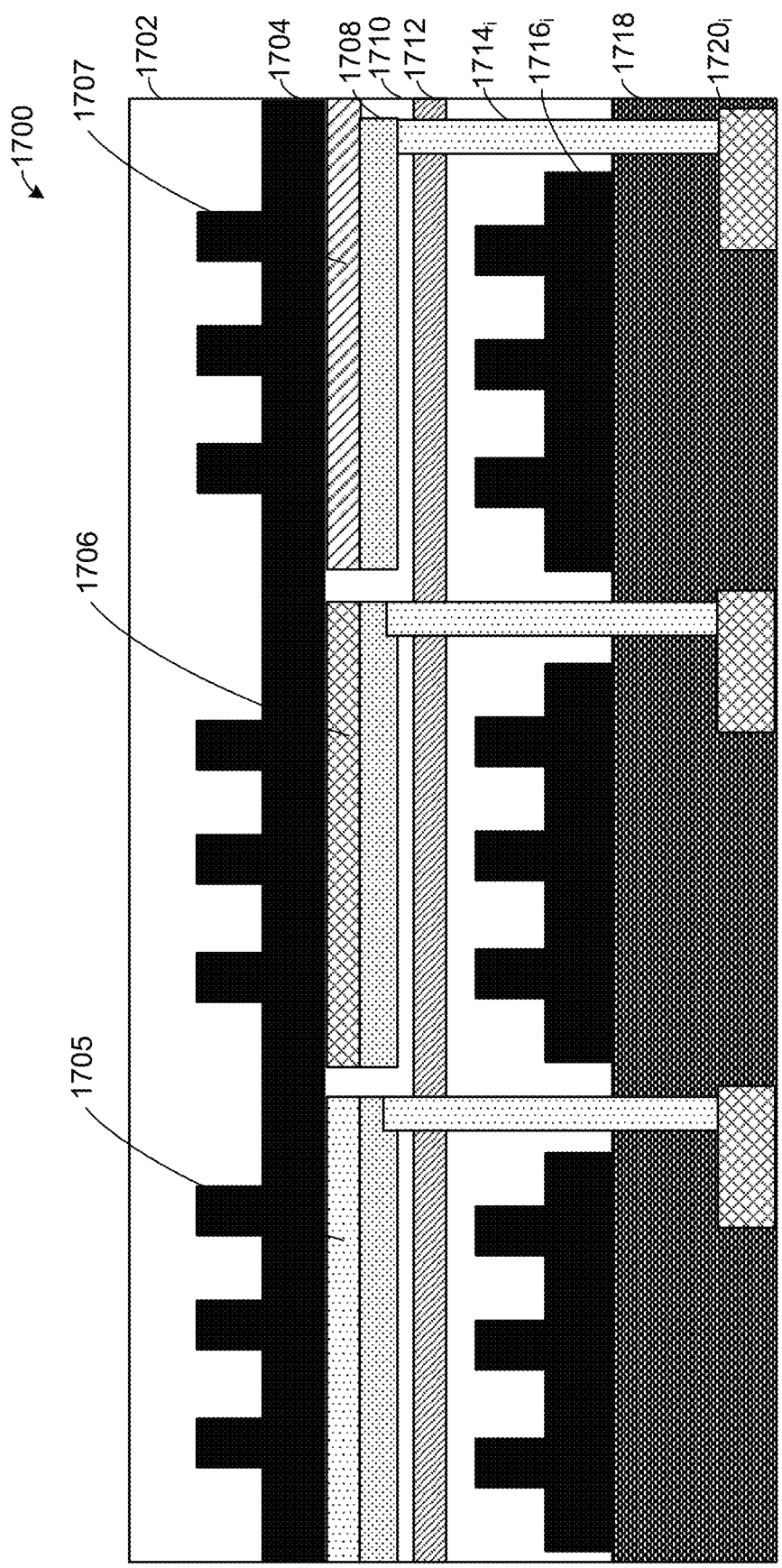
FIG. 17 illustrates a cross-section view of a display device, according to various other embodiments.

FIG. 17 illustrates a cross-section view of a display device 1700, according to various other embodiments. All or some of the components shown in FIG. 17 may be in physical contact with one another, optically in contact with one another, have index matching fluid or optical glue between one another, and/or may have space therebetween.

As shown, the display device 1700 includes a cap layer 1702, a meta-reflector layer 1704, EL layers 1705, 1706, and 1707, a pixelated anode layer 1708, a planarization layer 1710, an optional waveplate 1712, electronic vias 17141 (referred to herein collectively as electronic vias 1714 and individually as an electronic via 1714), multiple bottom meta-reflectors 17161 (referred to herein collectively as meta-reflectors 1716 and individually as a meta-reflector 1716), a substrate 1718, and electronic circuitry 17201 connected to the electronic vias 1714 (referred to herein collectively as electronic circuitry 1720 and individually as an electronic circuitry 1720), which may be constructed from any technically feasible materials and have any suitable size. The cap layer 1702, the meta-reflector layer 1704, the pixelated anode layer 1708, the planarization layer 1710, the optional waveplate 1712, the electronic vias 1714, the bottom meta-reflectors 1716, the substrate 1718, and the electronic circuitry 1720 are similar to the cap layer 1302, the meta-reflector layer 1304, the pixelated anode layer 1308, the planarization layer 1310, the optional waveplate 1312, the electronic vias 1314, the bottom meta-reflectors 1316, the substrate 1318, and the electronic circuitry 1320, respectively, that are described above in conjunction with FIG. 13.

However, the display device 1700 includes separate layers of EL materials, shown as the EL layers 1705, 1706, and 1707, for different colors of light (e.g., red, green, and blue). Similar to the discussion above in conjunction with FIG. 15, in some embodiments, each separate EL layer 1705, 1706, or 1707 corresponds to a color pixel or sub-pixel that can include an EL material layer and optional carrier transport and blocking layers.

Figure 18:
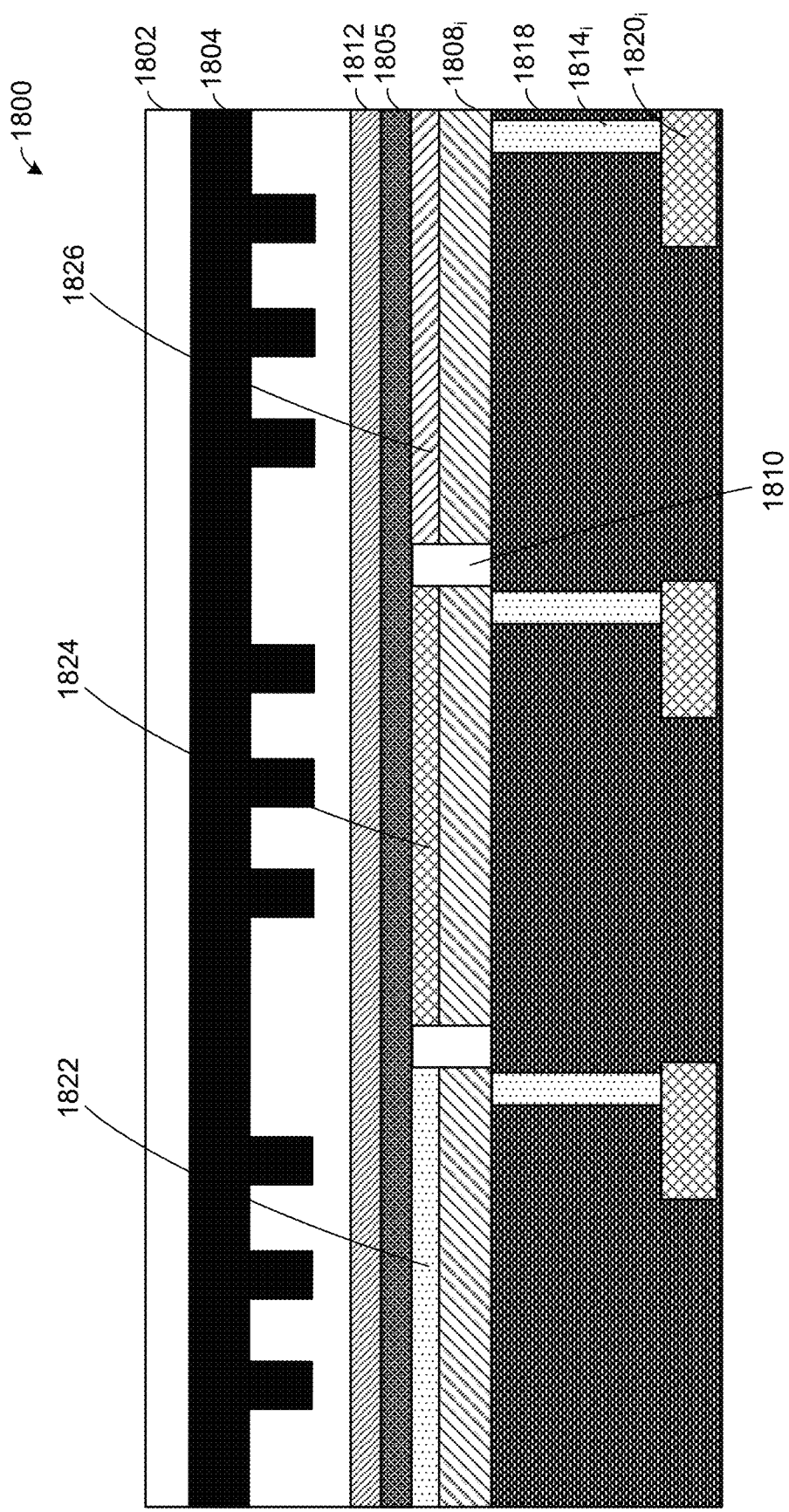
FIG. 18 illustrates a cross-section view of a display device, according to various other embodiments.

FIG. 18 illustrates a cross-section view of a display device 1800, according to various other embodiments. All or some of the components shown in FIG. 18 may be in physical contact with one another, optically in contact with one another, have index matching fluid or optical glue between one another, and/or may have space therebetween.

As shown, the display device 1800 includes a cap layer 1802, a meta-reflector layer 1804, an optional waveplate 1812, a common anode layer 1805, EL layers 1822, 1824, and 1826, multiple bottom reflectors 18081 (referred to herein collectively as bottom reflectors 1808 and individually as a bottom reflector 1808) that act as a pixelated anode layer, a planarization layer 1810, electronic vias 18141 (referred to herein collectively as electronic vias 1814 and individually as an electronic via 1814), a substrate 1818, and electronic circuitry 18201 connected to the electronic vias 1814 (referred to herein collectively as electronic circuitry 1820 and individually as an electronic circuitry 1820), which may be constructed from any technically feasible materials and have any suitable size. The cap layer 1802, the meta-reflector layer 1804, the optional waveplate 1812, the common anode layer 1805, the bottom reflectors 1808, the planarization layer 1810, the electronic vias 1814, the substrate 1818, and the electronic circuitry 1820 are similar to the cap layer 1402, the meta-reflector layer 1404, the optional waveplate 1412, the common anode layer 1405, the bottom reflectors 1408, the planarization layer 1410, the electronic vias 1414, the substrate 1418, and the electronic circuitry 1420, respectively, that are described above in conjunction with FIG. 14.

However, the display device 1800 includes separate layers of EL materials, shown as the EL layers 1822, 1824, and 1826, for different colors of light (e.g., red, green, and blue). Similar to the discussion above in conjunction with FIG. 15, in some embodiments, each separate EL layer 1822, 1824, or 1826 corresponds to a color pixel or sub-pixel that can include the EL material layer and optional carrier transport and blocking layers in some embodiments.

Figure 19:
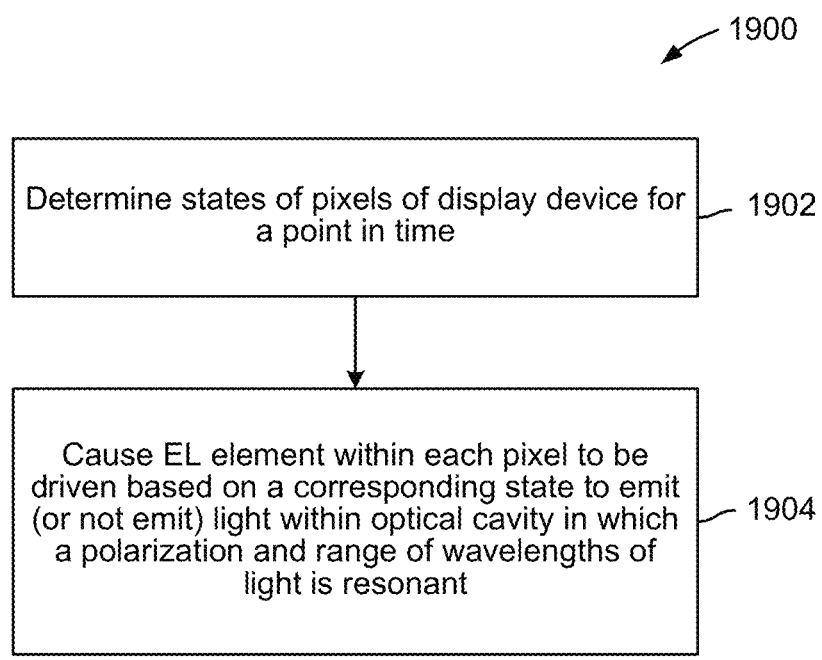
FIG. 19 is a flow diagram illustrating a method for displaying an image, according to various embodiments.

FIG. 19 is a flow diagram illustrating a method for displaying an image, according to various embodiments. Although the method steps are described with reference to the systems of FIGS. 1-18, persons skilled in the art will understand that any system may be configured to implement the method steps, in any order, in other embodiments.

As shown, a method 1900 begins at step 1902, where an application determines the states of pixels of a display device for a point in time. In some embodiments, the display device can be one of the display devices 800, 1200, 1300, 1400, 1500, 1600, 1700, or 1800 described above in conjunction with FIGS. 8 and 12-18, respectively. The pixel states can be associated with, e.g., a standalone image or a frame of a video. The application may be, e.g., one of the applications stored in the application store 355, which as described above with respect to FIG. 3 can include gaming applications, conferencing applications, video playback applications, or any other suitable applications At step 1904, the application causes an EL element within each pixel to be driven based on a corresponding state to emit light within an optical cavity in which a polarization and range of wavelengths of light is resonant, or to not emit light. As described above in conjunction with FIGS. 8 and 12-18, respectively, the optical cavity can include meta-reflector(s) and/or a waveplate that cause light emitted by the EL element that has a particular polarization and is within a particular range of wavelengths to resonate within the optical cavity. As a result, light output by the pixel primarily has the particular polarization and is within the particular range of wavelengths. In addition, the meta-reflector(s) can be used to control light output by the pixel to be within a particular range of angles in some embodiments.

One advantage of the display devices disclosed herein is that the disclosed display devices emit polarized light. Accordingly, the disclosed display devices can be used in conjunction with polarization-sensitive optical elements to produce light with higher brightness and power efficiency relative to light that is produced when conventional display devices are used in conjunction with polarization-sensitive optical elements. Further, different groups of pixels in the disclosed display devices can be configured to produce output light of different polarization states, which can enable polarization multiplexing. In addition, the reflection properties of each meta-reflector (which can include multiple nanostructures) corresponding to a pixel or sub-pixel can be configured to tailor the light emission angular profile of that pixel or sub-pixel. These technical advantages represent one or more technological advancements over prior art approaches.

1. In some embodiments, a display element comprises an electroluminescent (EL) light source, and a plurality of reflective elements, wherein the plurality of reflective elements form a resonant cavity for a polarization of light.

2. The display element of clause 1, wherein the plurality of reflective elements further form a resonant cavity for a range of wavelengths of the light.

3. The display element of clauses 1 or 2, wherein at least one reflective element included in the plurality of reflective elements comprises a meta-reflector.

4. The display element of any of clauses 1-3, wherein the meta-reflector is anisotropic or chiral.

5. The display element of any of clauses 1-4, wherein the meta-reflector comprises an array of anisotropic- or chiral-shaped nanopillars or nanostructures.

6. The display element of any of clauses 1-5, wherein the meta-reflector comprises an array of anisotropic- or chiral-shaped nanostructures embedded within one or more films.

7. The display element of any of clauses 1-6, wherein the meta-reflector causes light to be emitted by the display element within a range of angles.

8. The display element of any of clauses 1-7, wherein the meta-reflector is a cathode.

9. The display element of any of clauses 1-8, wherein the plurality of reflective elements comprise a plurality of meta-reflectors, and the light source is disposed between at least two of the plurality of meta-reflectors.

10. The display element of any of clauses 1-9, further comprising a waveplate.

11. The display element of any of clauses 1-10, wherein the EL light source comprises at least one of an OLED (organic light-emitting diode), QLED (quantum light-emitting diode), QDEL (quantum dot electro luminescent), or PeLED (Perovskite light-emitting diode) light source.

12. The display element of any of clauses 1-11, further comprising a common cathode and a pixelated anode, wherein the pixelated anode is connected to electronic circuitry.

13. In some embodiments, a display device comprises a plurality of pixels, each of the pixels comprising an electroluminescent element, and a plurality of reflective elements, wherein the plurality of reflective elements form a resonant cavity for a polarization of light.

14. The display device of clause 13, wherein the plurality of reflective elements further form a resonant cavity for a range of wavelengths of the light.

15. The display device of clauses 13 or 14, wherein at least one reflective element included in the plurality of reflective elements comprises a meta-reflector.

16. The display device of any of clauses 13-15, wherein the meta-reflector is anisotropic or chiral.

17. The display device of any of clauses 13-16, wherein the meta-reflector causes light to be emitted by the display element within a range of angles.

18. The display device of any of clauses 13-17, wherein the meta-reflector comprises an array of nanopillars and a liquid crystal material between the nanopillars.

19. The display device of any of clauses 13-18, wherein the plurality of reflective elements comprise a plurality of meta-reflectors, and the light source is disposed between at least two of the plurality of meta-reflectors.

20. The display device of any of clauses 13-19, wherein each of the pixels further comprises a waveplate.

21. The display device of any of clauses 13-20, wherein each of the pixels further comprises one or more layers of one or more planarization materials.

22. The display device of any of clauses 13-21, wherein each of the pixels further comprises one or more layers of one or more dielectric materials.

23. In some embodiments, a computer-implemented method comprises determining states of a plurality of pixels for at least one point in time, driving each pixel included in the plurality of pixels based on a corresponding state, wherein driving the pixel comprises driving an electroluminescent element to emit light within an optical cavity, wherein a polarization of light is resonant within the optical cavity.

24. The computer-implemented method of clause 23, wherein a range of wavelengths of the light is further resonant within the optical cavity.

25. The computer-implemented method of clauses 23 or 24, wherein the optical cavity comprises at least one of a meta-reflector or a waveplate.

Any and all combinations of any of the claim elements recited in any of the claims and/or any elements described in this application, in any fashion, fall within the contemplated scope of the present disclosure and protection.

The foregoing description of the embodiments of the disclosure has been presented for the purpose of illustration; it is not intended to be exhaustive or to limit the disclosure to the precise forms disclosed. Persons skilled in the relevant art can appreciate that many modifications and variations are possible in light of the above disclosure.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the disclosure may also relate to a product that is produced by a computing process described herein. Such a product may comprise information resulting from a computing process, where the information is stored on a non-transitory, tangible computer readable storage medium and may include any embodiment of a computer program product or other data combination described herein.

Finally, the language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

The descriptions of the various embodiments have been presented for purposes of illustration, but are not intended to be exhaustive or limited to the embodiments disclosed. Many modifications and variations is apparent to those of ordinary skill in the art without departing from the scope and spirit of the described embodiments.

Aspects of the present embodiments may be embodied as a system, method, or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It is understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine. The instructions, when executed via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable gate arrays.

The flowchart and block diagrams in the figures illustrate the architecture, functionality, and operation of possible implementations of systems, methods, and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A display element, comprising:
an electroluminescent (EL) light source; and
a plurality of reflective elements, wherein the plurality of reflective elements form a resonant cavity for a polarization of light, at least one reflective element included in the plurality of reflective elements comprises an array of nanopillars or nanostructures, and each nanopillar or nanostructure in the array of nanopillars or nanostructures has a shape in a same orientation.

2. The display element of claim 1, wherein the plurality of reflective elements further form a resonant cavity for a range of wavelengths of the light.

3. The display element of claim 1, wherein the at least one reflective element further comprises a meta-reflector.

4. The display element of claim 1, wherein each nanopillar or nanostructure in the array of nanopillars or nanostructures is anisotropic or chiral.

5. The display element of claim 1, wherein the nanostructures are embedded within one or more films.

6. The display element of claim 1, wherein the at least one reflective element causes light to be emitted by the display element within a range of angles.

7. The display element of claim 1, wherein the at least one reflective element comprises a cathode.

8. The display element of claim 1, wherein the plurality of reflective elements comprise a plurality of meta-reflectors, and the light source is disposed between at least two of the plurality of meta-reflectors.

9. The display element of claim 1, further comprising a waveplate.

10. The display element of claim 1, wherein the EL light source comprises at least one of an OLED (organic light-emitting diode), QLED (quantum light-emitting diode), QDEL (quantum dot electro luminescent), or PeLED (Perovskite light-emitting diode) light source.

11. The display element of claim 1, further comprising a common cathode and a pixelated anode, wherein the pixelated anode is connected to electronic circuitry.

12. A display device, comprising:
a plurality of pixels, each of the pixels comprising:
an electroluminescent element, and
a plurality of reflective elements, wherein the plurality of reflective elements form a resonant cavity for a polarization of light, at least one reflective element included in the plurality of reflective elements comprises an array of nanopillars or nanostructures, and each nanopillar or nanostructure in the array of nanopillars or nanostructures has a shape in a same orientation.

13. The display device of claim 12, wherein the plurality of reflective elements further form a resonant cavity for a range of wavelengths of the light.

14. The display device of claim 12, wherein the at least one reflective element further comprises a meta-reflector.

15. The display device of claim 12, wherein each nanopillar or nanostructure in the array of nanopillars or nanostructures is anisotropic or chiral.

16. The display device of claim 12, wherein the at least one reflective element causes light to be emitted by the display element within a range of angles.

17. The display device of claim 12, wherein the at least one reflective element comprises an array of nanopillars and a liquid crystal material between the nanopillars.

18. The display device of claim 12, wherein the plurality of reflective elements comprise a plurality of meta-reflectors, and the light source is disposed between at least two of the plurality of meta-reflectors.

19. The display device of claim 12, wherein each of the pixels further comprises a waveplate.

20. The display device of claim 12, wherein each of the pixels further comprises one or more layers of one or more planarization materials.

21. The display device of claim 12, wherein each of the pixels further comprises one or more layers of one or more dielectric materials.

22. A computer-implemented method, comprising:
determining states of a plurality of pixels for at least one point in time;
driving each pixel included in the plurality of pixels based on a corresponding state, wherein driving the pixel comprises:
driving an electroluminescent element to emit light within an optical cavity formed by a plurality of reflective elements, wherein a polarization of light is resonant within the optical cavity, at least one reflective element included in the plurality of reflective elements comprises an array of nanopillars or nanostructures, and each nanopillar or nanostructure in the array of nanopillars or nanostructures has a shape in a same orientation.

23. The computer-implemented method of claim 22, wherein a range of wavelengths of the light is further resonant within the optical cavity.

24. The computer-implemented method of claim 22, wherein a waveplate is disposed within the optical cavity.

* * * * *